United States Patent
Okubo et al.

(10) Patent No.: US 9,405,608 B2
(45) Date of Patent: Aug. 2, 2016

(54) STORAGE CONTROLLER, STORAGE DEVICE, INFORMATION PROCESSING SYSTEM, AND STORAGE CONTROL METHOD

(71) Applicant: Sony Corporation, Tokyo (JP)

(72) Inventors: Hideaki Okubo, Saitama (JP); Kenichi Nakanishi, Tokyo (JP); Yasushi Fujinami, Tokyo (JP); Keiichi Tsutsui, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 120 days.

(21) Appl. No.: 14/167,616

(22) Filed: Jan. 29, 2014

(65) Prior Publication Data

US 2014/0229761 A1  Aug. 14, 2014

(30) Foreign Application Priority Data

Feb. 14, 2013  (JP) .................................. 2013-026493

(51) Int. Cl.
  *G06F 11/00* (2006.01)
  *G06F 11/07* (2006.01)
  *G06F 11/10* (2006.01)
  *G11C 16/34* (2006.01)

(52) U.S. Cl.
  CPC ............ *G06F 11/073* (2013.01); *G06F 11/076* (2013.01); *G06F 11/1004* (2013.01); *G06F 11/1016* (2013.01); *G06F 11/1044* (2013.01); *G06F 11/1048* (2013.01); *G11C 16/3431* (2013.01)

(58) Field of Classification Search
  CPC ............. G06F 11/073; G06F 11/1004; G06F 11/0793; G06F 11/1044; G06F 11/1016; G06F 11/0751; G06F 11/0787; G06F 11/08; G06F 11/1012
  See application file for complete search history.

(56) References Cited

U.S. PATENT DOCUMENTS

| | | | |
|---|---|---|---|
| 2011/0041039 A1* | 2/2011 | Harari et al. ................. | 714/773 |
| 2011/0161784 A1* | 6/2011 | Selinger et al. .............. | 714/768 |
| 2013/0054871 A1* | 2/2013 | Lassa ............................. | 711/103 |
| 2013/0139030 A1* | 5/2013 | Okubo et al. ................. | 714/755 |
| 2014/0146624 A1* | 5/2014 | Son et al. ..................... | 365/200 |

* cited by examiner

*Primary Examiner* — Charles Ehne
(74) *Attorney, Agent, or Firm* — Chip Law Group

(57) ABSTRACT

A storage controller includes: an error information management section configured to manage information in a plurality of addresses of a memory; and a refresh object determination section configured to determine a refresh object address in the memory based on the error information.

16 Claims, 30 Drawing Sheets

221

| NUMBER OF ERRORS | PHYSICAL ADDRESS |
|---|---|
| 5 | 0x00001020 |
| 4 | 0x00B23501 |
| 4 | 0x01687A30 |
| 0 | — |

ENTRY { (first row)

| LOGICAL ADDRESS | PHYSICAL ADDRESS |
|---|---|
| 0x00000000 | 0x00000000 |
| 0x00000001 | 0x00000003 |
| ⋮ | ⋮ |
| 0x08000000 | 0x08008461 |

| START LOGICAL ADDRESS | SIZE |
|---|---|
| 0x00001234 | 16 |
| 0x000000A0 | 128 |
| ⋮ | ⋮ |
| 0x0008A080 | 64 |

| NUMBER OF ERRORS | PHYSICAL ADDRESS | NUMBER OF READING TIMES |
|---|---|---|
| 5 | 0x00001020 | 3 |
| 4 | 0x00B23501 | 10 |
| 4 | 0x01687A30 | 1 |
| 0 | — | — |

ENTRY { (first row)

| NUMBER OF ERRORS | PHYSICAL ADDRESS |
|---|---|
| 5 | 0x00001020 |
| 4 | 0x00B23501 |
| 4 | 0x01687A30 |
| 4 | 0x00000001 |

| NUMBER OF ERRORS | PHYSICAL ADDRESS | CONTENTS |
|---|---|---|
| 5 | 0x00001020 | DATE+ECC (528 BYTES) |
| 4 | 0x00B23501 | DATE+ECC (528 BYTES) |
| 4 | 0x01687A30 | DATE+ECC (528 BYTES) |
| 4 | 0x00000001 | DATE+ECC (528 BYTES) |

| NUMBER OF ERRORS | PHYSICAL ADDRESS | CONTENTS |
|---|---|---|
| 5 | 0x00001020 | DATE+ECC (512 BYTES) |
| 4 | 0x00B23501 | DATE+ECC (512 BYTES) |
| 4 | 0x01687A30 | DATE+ECC (512 BYTES) |
| 4 | 0x00000001 | DATE+ECC (512 BYTES) |

| NUMBER OF ERRORS | PHYSICAL ADDRESS | CONTENTS |
|---|---|---|
| 7 | 0x00001020 | DATE+ECC (528 BYTES) |
| 6 | 0x00B23501 | DATE+ECC (528 BYTES) |
| 5 | 0x01687A30 | — |
| 4 | 0x00000001 | — |

FIG. 24

STORAGE CONTROLLER, STORAGE DEVICE, INFORMATION PROCESSING SYSTEM, AND STORAGE CONTROL METHOD

CROSS REFERENCE TO RELATED APPLICATIONS

This application claims the benefit of Japanese Priority Patent Application JP 2013-026493 filed Feb. 14, 2013, the entire contents of which are incorporated herein by reference.

BACKGROUND

The present technology relates to a storage controller. Specifically, the present technology relates to a storage controller for a non-volatile memory, a storage device for a non-volatile memory, an information processing system for a non-volatile memory, a processing method therein, and a program causing a computer to execute the processing method.

In an information processing system, a Dynamic Random Access Memory (DRAM) or the like is used as a work memory. The DRAM is normally a volatile memory, and memory contents thereof are lost when a power supply is stopped. On the other hand, in recent years, a non-volatile memory (NVM) is used. The non-volatile memory is roughly classified into a flash memory supporting data access with a large size of data as a unit, and a non-volatile RAM (NVRAM) providing high-speed random access with a small unit. The flash memory is typified by a NAND flash memory. On the other hand, the non-volatile RAM is typified by a resistance RAM (ReRAM), a phase-change RAM (PCRAM), a magneto resistive RAM (MRAM).

In the non-volatile memory, to avoid an event in which storage state is changed with lapse of time, a refresh process in which the storage state is rewritten to be corrected before the change of the storage state is carried out. As a known memory system in related art, there is a memory system in which a memory controller autonomously executes a refresh process without receiving an instruction from a host computer when an error is detected at the time of reading data from a non-volatile memory (for example, refer to Japanese Unexamined Patent Application Publication No. 2008-192267). In addition, a memory system in which a host computer receives notification of error detection at the time of reading data and the host computer executes a refresh command at appropriate timing has been proposed (for example, refer to Japanese Unexamined Patent Application Publication No. 2008-192267). In the refresh process, error correction is executed on data in which errors are detected, and the corrected data is written into the non-volatile memory.

SUMMARY

In the above-described technology in related art, when the memory controller autonomously executes the refresh process during execution of a read command, a write process occurs in addition to data read process from the non-volatile memory that occurs in association with the execution of the read command. Therefore, as compared with a case where the refresh process is not executed, a time necessary for completion of the read command is increased, which results in performance degradation of the read command.

In addition, a case where the memory controller autonomously executes the refresh process after completion of the read command and before execution of subsequent read command or write command is assumed. In this case, if the host computer executes the subsequent command during the refresh process, waiting of access to the non-volatile memory for the subsequent process is necessary until access to the non-volatile memory for the refresh process is completed. In other words, as a result, that causes performance degradation of the read command and the write command.

On the other hand, a case where the refresh process is executed in response to an instruction from the host computer is assumed. In this case, when an error is detected during the execution of the read command, error occurrence is notified to the host computer after completion of the read command process. The host computer selects a timing of issuing a refresh command, and issues the refresh command based on the notified information. To suppress performance degradation of the write command and the read command, it is necessary for the host computer to execute the refresh command at a timing when the write command or the read command is not executed. However, when the write command and the read command are successively executed and an error is detected due to the plurality of commands in a state where the refresh command is not allowed to be executed immediately, the error information is not allowed to be correctly held.

It is desirable to appropriately control a refresh process for a non-volatile memory.

According to an embodiment of the technology, there is provided a storage controller including: an error information management section configured to manage error information in a plurality of addresses of a memory; and a refresh object determination section configured to determine a refresh object address in the memory based on the error information. Accordingly, there is provided a function of determining the refresh object address based on the error information in the plurality of addresses.

According to an embodiment of the technology, there is provided a storage control method including: managing error information in a plurality of addresses of a memory; and determining a refresh object address in the memory, based on the error information. Accordingly, there is provided a function of determining the refresh object address based on the error information in the plurality of addresses.

In the respective embodiments of the technology, the error information management section may manage, as the error information, an address where errors are detected in association with the number of detected errors, and the refresh object determination section may determine the address associated with the number of errors as the refresh object address, based on the number of errors. Accordingly, there is provided a function of determining the refresh object address based on the number of errors.

In the respective embodiments of the technology, the error information management section may determine whether the error information is excluded from management objects, based on the number of errors. Accordingly, there is provided a function of excluding the address from the management objects.

In the respective embodiments of the technology, the error information management section may further manage, as the error information, the number of reading times in association with the address, and the refresh object determination section may determine the address associated with the number of reading times as the refresh object address, based on the number of reading times. Accordingly, there is provided a function of determining the refresh object address based on the number of reading times.

In the respective embodiments of the technology, when errors occur in the memory, the error information management section may determine whether the error information is excluded from the management objects, based on a condition specified in advance. Accordingly, there is provided a function of excluding the error from the management objects based on the specified condition.

In the respective embodiments of the technology, the error information management section may manage, as the error information, a physical address of the memory where errors are detected in association with the number of detected errors, and the refresh object determination section may determine the physical address associated with the number of errors as the refresh object address, based on the number of errors. Accordingly, there is provided a function of determining the refresh object address from the physical addresses associated with the number of errors.

In the respective embodiments of the technology, an address conversion section configured to convert a logical address used in an access command from a host computer to the memory, into a physical address of the memory may be further provided. The error information management section may manage, as the error information, the logical address of the memory where errors are detected in association with the number of detected errors. The refresh object determination section may select the logical address associated with the number of errors based on the number of errors, and may convert the logical address into the physical address with use of the address conversion section, to determine the physical address as the refresh object address. Accordingly, there is provided a function of determining the refresh object address from the logical addresses associated with the number of errors.

In the respective embodiments of the technology, the error information management section may hold data stored in each of the addresses in the memory, and uses the data in accessing the address of the memory. The data is associated with the error information. Accordingly, there is provided a function of using the data associated with the error information without accessing the memory.

In the respective embodiments of the technology, the error information management section may hold an error correcting code in addition to the data. Accordingly, there is provided a function of using the data associated with the error information and the error correcting code without accessing the memory.

In the respective embodiments of the technology, the error information management section may hold the data only when the number of errors included in the error information satisfies a predetermined condition. Accordingly, there is provided a function of using the data without accessing the memory only when the specified condition is satisfied.

In the respective embodiments of the technology, the error information management section may notify a host computer of the error information when receiving an acquisition command of the error information from the host computer. Accordingly, there is provided a function of causing the host computer to acquire the error information in response to the command from the host computer.

According to an embodiment of the technology, there is provided a storage device including: a memory; an error information management section configured to manage error information in a plurality of addresses of the memory; and a refresh object determination section configured to determine a refresh object address in the memory, based on the error information. Accordingly, there is provided a function of determining the refresh object address based on the error information in the plurality of addresses of the memory.

According to an embodiment of the technology, there is provided an information processing system including: a memory; a host computer configured to issue an access command with respect to the memory; an error information management section configured to manage error information in a plurality of addresses of the memory; and a refresh object determination section configured to determine a refresh object address in the memory, based on the error information. Accordingly, there is provided a function of determining the refresh object address based on the error information in the plurality of addresses of the memory that is accessed according to the command from the host computer.

In the embodiment of the technology, the host computer may include the error information management section and the refresh object determination section. Accordingly, there is provided a function of causing the host computer to determine the refresh object address, based on the error information in the plurality of addresses of the memory.

According to the respective embodiments of the technology, there is provided an effect of appropriately controlling the refresh process for the non-volatile memory.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 4 is a diagram illustrating a structure example of an error information management table 221 according to the first embodiment of the technology.

FIG. 5 is a diagram illustrating a structure example of an address conversion table 222 according to the first embodiment of the technology.

FIG. 15 is a diagram illustrating a structure example of a management object address table 223 according to the modification of the first embodiment of the technology.

FIG. 17 is a diagram illustrating a structure example of the error information management table 221 according to a modification of the first embodiment of the technology.

FIG. 19 is a diagram illustrating a structure example of an error information management table 221 according to a second embodiment of the technology.

FIG. 21 is a diagram illustrating a structure example of an error information management table 221 according to a third embodiment of the technology.

FIG. 22 is a diagram illustrating a structure example of an error information management table 221 according to a fourth embodiment of the technology.

FIG. 24 is a diagram illustrating a structure example of an error information management table 221 according to a fifth embodiment of the technology.

DETAILED DESCRIPTION

Hereinafter, some embodiments of the technology will be described. The description will be given in the following order:

1. First embodiment (an example of managing error information by a memory controller)
2. Second embodiment (an example of managing error information with use of a logical address)
3. Third embodiment (an example of holding data and ECC together with error information)
4. Fourth embodiment (an example of holding data together with error information)
5. Fifth embodiment (an example of preventing data holding based on the number of errors)
6. Sixth embodiment (an example of notifying a host computer of error information)
7. Seventh embodiment (an example of managing error information by a host computer)

(1. First Embodiment)
(Configuration of Information Processing System)

Figure 1:
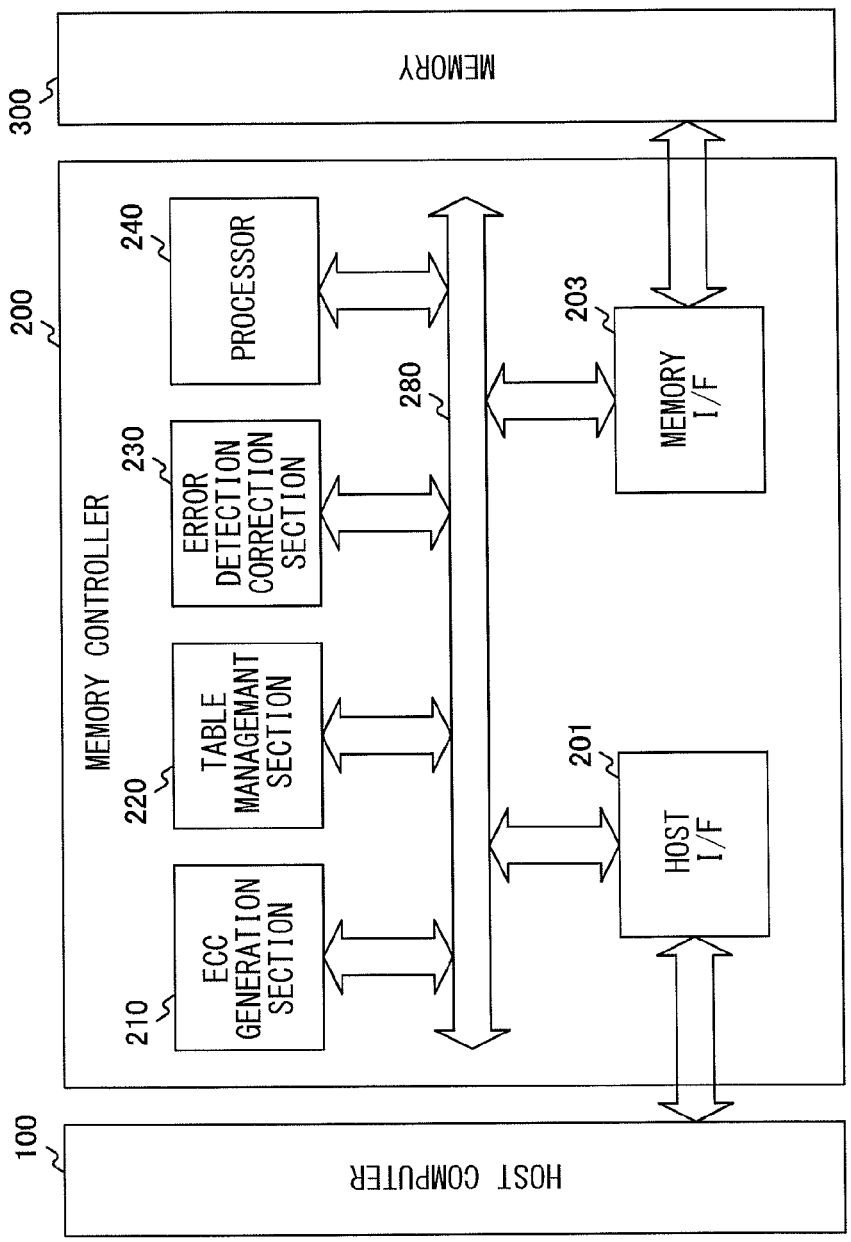
FIG. 1 is a diagram illustrating a configuration example of an information processing system according to a first embodiment of the technology.

FIG. 1 is a diagram illustrating a configuration example of an information processing system according to a first embodiment of the technology. The information processing system includes a host computer 100, a memory controller 200, and a memory 300. The memory controller 200 and the memory 300 configure a storage system.

The host computer 100 is configured to issue, to the memory 300, a command for requesting reading, writing, refreshing, or the like of data.

The memory controller 200 is configured to receive a command from the host computer 100 to execute data writing to the memory 300 and to execute data reading from the memory 300. When the memory controller 200 receives a write command, the memory controller 200 writes data received from the host computer 100 into the memory 300. In addition, when the memory controller 200 receives a read command, the memory controller 200 reads data from the memory 300, and transfers the data to the host computer 100. Moreover, when the memory controller 200 receives a refresh command, the memory controller 200 reads data from the memory 300, and rewrites the read data to the memory 300.

In the write command and the read command, a logical address indicating a head of storage location of the memory 300 and a data size are used. In the first embodiment, the logical address is location information allocated to a region divided into 512-byte units. A value of a data size specified by a host system in the write command and the read command is a value "n" represented by 512×n bytes. The logical address is converted into a physical address by the memory controller 200. The physical address is an address allocated to a memory cell in the memory 300.

The memory controller 200 includes an ECC generation section 210, a table management section 220, an error detection correction section 230, a processor 240, a host interface 201, and a memory interface 203. These sections are mutually connected by a bus 280.

The ECC generation section 210 is configured to generate an error correcting code (ECC) of data stored in the memory 300. The error detection correction section 230 is configured to execute error detection and correction processing of data read from the memory 300.

The processor 240 is configured to control the entire memory controller 200. The processor 240 executes software stored in a ROM (not illustrated). The processor 240 interprets a command issued by the host computer 100 to supply necessary requests to the memory 300. Note that the processor 240 is a specific example of "refresh object determination section" in the technology.

The table management section 220 is configured to manage an error information management table, an address conversion table, and the like which will be described later.

The host interface 201 is connected to the host computer 100, and is configured to receive commands from the host computer 100 and to transmit/receive data to/from the host computer 100.

The memory interface 203 is connected to the memory 300, and is configured to transmit a request and write data to the memory 300, and to receive read data from the memory 300.

The memory 300 is a control object of the memory controller 200, and in this example, a non-volatile memory is mainly assumed as the memory 300.

(Memory Structure)

Figure 2:
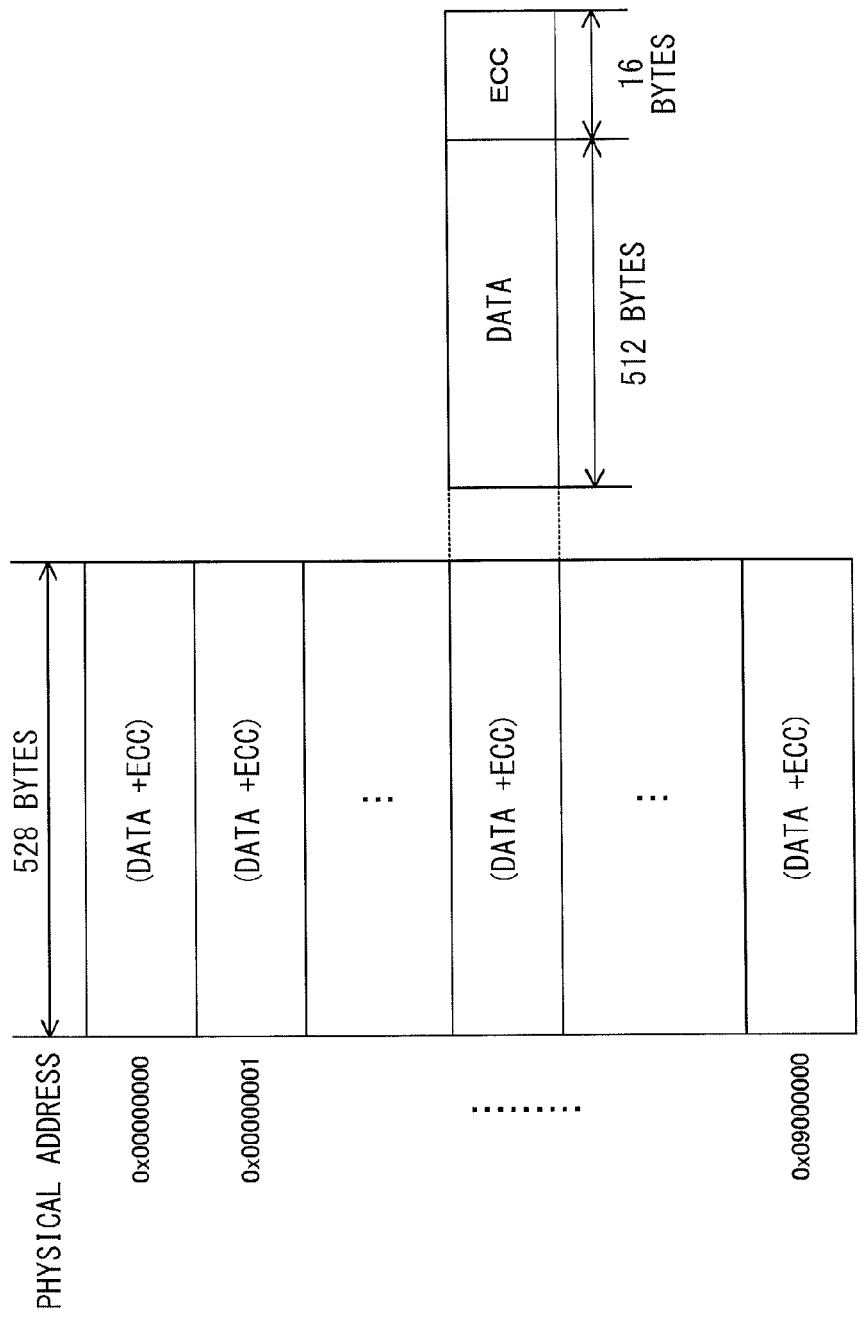
FIG. 2 is a diagram illustrating an example of a storage structure of a memory 300 according to the first embodiment of the technology.

FIG. 2 is a diagram illustrating an example of a storage structure of the memory 300 according to the first embodiment of the technology. The memory 300 is configured of physical pages of 528 bytes. The write request and the read request from the memory controller 200 to the memory 300 are executed on a physical page basis. A physical address is assigned to each physical page, as a unique address.

512-byte data added with 16-byte ECC is written into one physical page. The 512-byte data is data accessed by the host computer 100 in response to the write command and the read command. The 512-byte data is a management object by the table management section 220. The 16-byte ECC added to the 512-byte data is assumed to have a correction ability of 8 bits.

(Configuration of Table Management Section)

Figure 3:
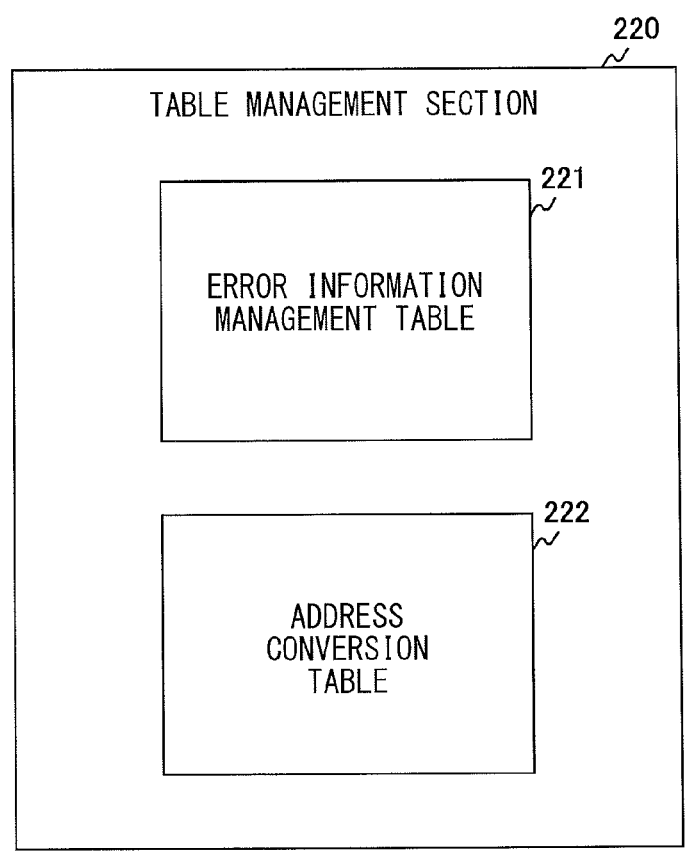
FIG. 3 is a diagram illustrating a configuration example of a table management section 220 according to the first embodiment of the technology.

FIG. 3 is a diagram illustrating a configuration example of the table management section 220 according to the first embodiment of the technology. The table management section 220 includes an error information management table 221 and an address conversion table 222.

The error information management table 221 is a table used for managing information about an error that occurs in the memory 300. Note that the error information management table 221 is a specific example of "error information management section" in the technology.

The address conversion table 222 is a table used for converting a logical address into a physical address in the memory 300. Note that the address conversion table 222 is a specific example of "address conversion section" in the technology.

FIG. 4 is a diagram illustrating a structure example of the error information management table 221 according to the first embodiment of the technology. The error information management table 221 holds a plurality of entries. Each of the plurality of entries includes a physical address where an error occurs of the memory 300 and the number of detected errors that are paired. The number of errors indicates the number of bits where an error is detected.

An entry where the number of errors is "0" is handled as an empty entry. The physical address of the empty entry is ignored as an invalid value. In this example, three entries are valid among four entries.

Incidentally, although the entries are described in descending order of the number of errors in this example, sorting in descending order is not necessary in operation of the error information management table 221. In addition, a flag for distinguishing valid and invalid of an entry may be provided in addition to the number of errors and the physical addresses, instead of handling the entry where the number of errors is "0" as an empty entry.

FIG. 5 is a diagram illustrating a structure example of the address conversion table 222 according to the first embodiment of the technology. The address conversion table 222 holds pairs of logical addresses and physical addresses of the memory 300. In the first embodiment, a logical address is subjected to addressing with 512 bytes as a unit. 512-byte data written into one logical address is written into one physical page of the memory 300. Therefore, one logical address is converted into one physical address.

(Operation of Read Command Process)

Figure 6:
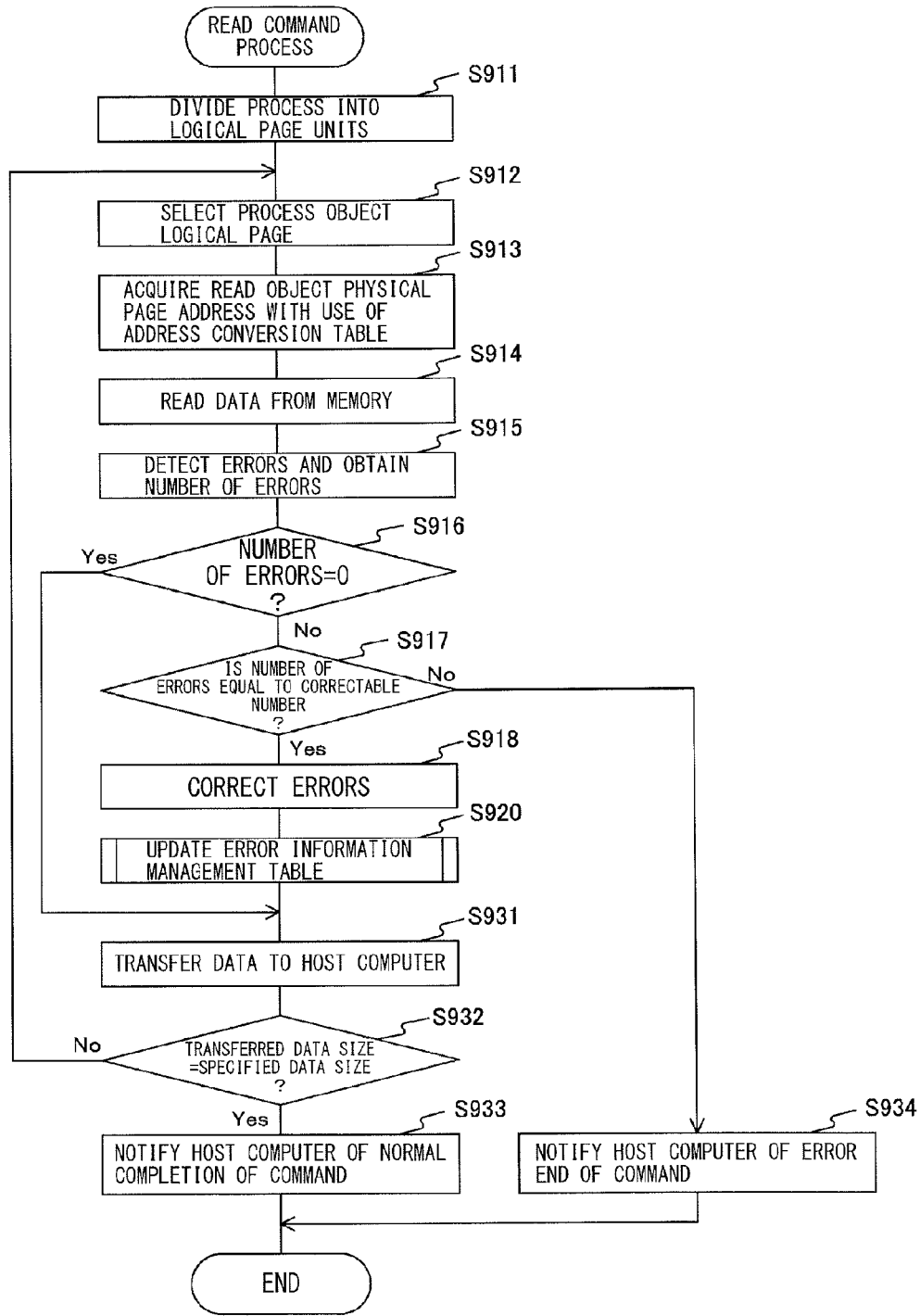
FIG. 6 is a flowchart illustrating an example of a process procedure of a read command process according to the first embodiment of the technology.

FIG. 6 is a flowchart illustrating an example of a process procedure of a read command process according to the first embodiment of the technology. In other words, the process procedure is a process procedure executed when the memory controller 200 receives a read command from the host computer 100.

First, the processor 240 divides the process into logic address units, based on a head logical address of a read object and a data size that are received by the host interface 201 (step S911). One logical address is processed by one process. For example, in a case where "0" is specified as the head address of the read object and "1" is specified as the data size, one process is executed. In a case where "0" is specified as the head logical address of the read object and "2" is specified as the data size, the process is divided into two processes.

The processor 240 determines a logical address to be read (step S912). The logical address to be read is determined in order based on the head logical addresses of the respective read objects. For example, in a case where "0" is specified as the head logical address of the read object and "2" is specified as the data size, the logical address to be subjected to the process first is determined to "0". Then, the logical address to be subjected to the process subsequently is determined to "1".

The processor 240 converts the logical address determined to be read into a physical address with use of the address conversion table 222 held in the table management section 220 (step S913).

The processor 240 specifies the physical address converted at the step S913 to perform read request to the memory 300 (step S914). The data read from the memory 300 has 528 bytes including the ECC.

The data and the ECC read from the memory 300 are transferred to the error detection correction section 230. In the error detection correction section 230, error detection is executed on 528-byte data including the data and the ECC. When errors are detected, the number of error bits (the number of errors) is acquired (step S915). When an error is not detected, the number of error bits is set to 0.

The processor 240 determines whether the number of errors obtained at the step S915 is 0 (step S916). When the number of errors is 0, namely, when an error is not detected (Yes at the step S916), the processes of the following steps S917 to S920 are skipped.

When errors are detected, the processor 240 determines whether the number of detected errors exceeds the correctable number of errors ("8" in this case) (step S917). When the number of detected errors exceeds the correctable number of errors (No at the step S917), the processor 240 notifies the host computer 100 of error occurrence in the read command process to terminate the read command process (step S934).

On the other hand, when the number of detected errors is within the correctable number of errors, the error detection correction section 230 executes error correction on 528-byte data transferred from the memory 300 (step S918). After the error correction, the processor 240 executes update of the error information management table 221 held in the table management section 220 (step S920).

After the error detection and the error correction, or when an error is not detected, 512-byte data excluding the ECC is transferred to the host computer 100 through the host interface 201 (step S931).

Then, in the read command process, the processor 240 compares the sum of the sizes of the data transferred to the host computer 100 with the data size specified by the read command (step S932). When the sum of the sizes of the transferred data is smaller than the specified data size (No at the step S932), the processes at the step S912 and following steps are repeated. On the other hand, when the sum of the sizes of the transferred data reaches the specified data size (Yes at the step S932), the processor 240 notifies the host computer 100 of normal completion of the read command process to terminate the read command process (step S933).

(Operation of Update Process of Error Information Management Table)

Figure 7:
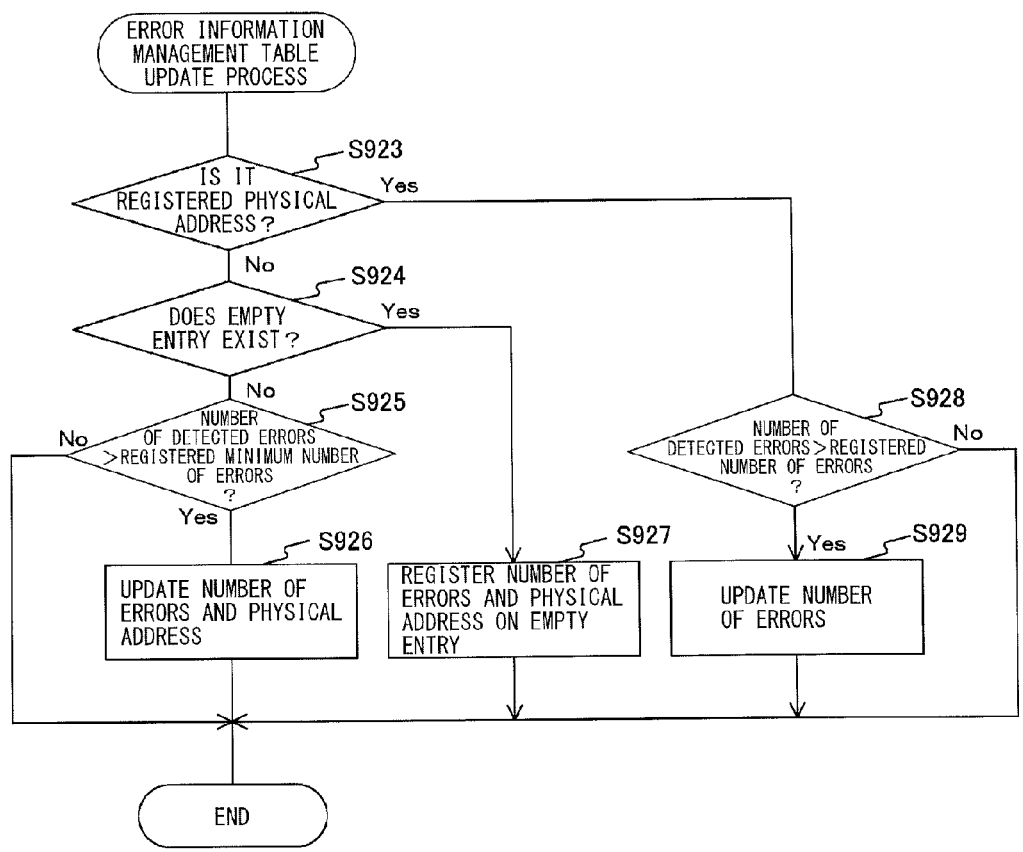
FIG. 7 is a flowchart illustrating an example of a process procedure of update of the error information management table according to the first embodiment of the technology.

FIG. 7 is a flowchart illustrating an example of a process procedure of update of the error information management table according to the first embodiment of the technology.

First, it is determined whether the physical address where errors are detected at the step S915 is a physical address registered on the error information management table 221 (step S923). When the physical address where errors are detected is the registered physical address (Yes at the step S923), it is determined whether the number of detected errors is larger than the registered number of errors (step S928). When the number of detected errors is larger than the registered number of errors (Yes at the step S928), the number of errors in the corresponding entry in the error information management table 221 is updated with the number of detected errors (step S929).

When the physical address where errors are detected is not registered on the error information management table 221 (No at the step S923), it is determined whether the error information management table 221 has an empty entry (step S924). When the error information management table 221 has an empty entry (Yes at the step S924), the physical address where errors are detected and the number of detected errors are registered on the empty entry (step S927).

On the other hand, when the error information management table 221 has no empty entry (No at the step S924), the number of detected errors is compared with a minimum value out of the numbers of errors registered on the respective entries (step S925). When the number of detected errors is larger than the minimum value (Yes at the step S925), the entry having the minimum value is updated with the number of detected errors and the physical address where the errors are detected (step S926).

Incidentally, at the time of comparing the number of detected errors with the minimum value out of the numbers of errors registered on the respective entries at the step S925, the process at the step S926 may be executed when the number of detected errors is equal to or lager than the minimum value.

Figure 8:
FIG. 8 is a diagram illustrating a first example of the update of the error information management table according to the first embodiment of the technology.

FIG. 8 is a diagram illustrating an example of the update of the error information management table according to the first embodiment of the technology. This example is an example in a case where the physical address where errors are detected and the number of detected errors are registered on the empty entry at the step S927. It is found that a new content is added to a fourth entry.

Figure 9:
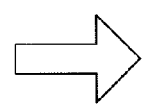
FIG. 9 is a diagram illustrating a second example of the update of the error information management table according to the first embodiment of the technology.

FIG. 9 is a diagram illustrating a second example of the update of the error information management table according to the first embodiment of the technology. This example is an example in a case where the number of errors in the corresponding entry in the error information management table 221 is updated with the number of detected errors at the step S929. It is found that the number of errors in a fourth entry is updated from "3" to "4".

Figure 10:
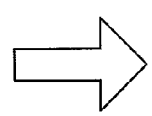
FIG. 10 is a diagram illustrating a third example of the update of the error information management table according to the first embodiment of the technology.

FIG. 10 is a diagram illustrating a third example of the update of the error information management table according to the first embodiment of the technology. This example is an example in a case where the entry having the minimum value of the number of errors is updated with the number of detected errors and the physical address where the errors are detected at the step S926. It is found that the physical address of "0x00001234" with the number of errors of "3" in a fourth entry is updated with the physical address of "0x00000001" with the number of errors of "4". In other words, the entry of the physical address of "0x00001234" is ejected and replaced with the entry of the physical address "0x00000001" with larger number of errors.

(Operation of Refresh Command Process)

Figure 11:
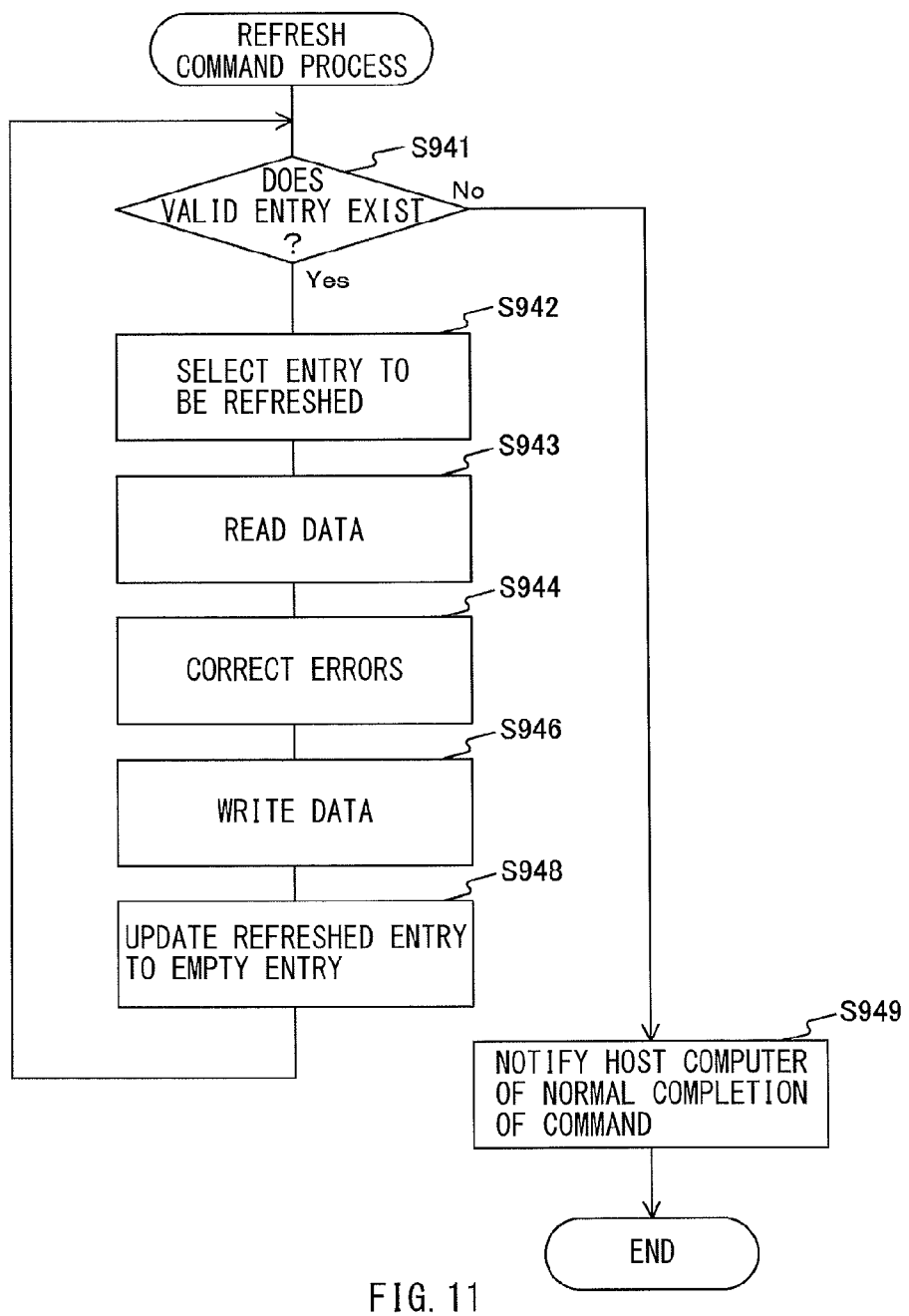
FIG. 11 is a flowchart illustrating an example of a process procedure of a refresh command process according to the first embodiment of the technology.

FIG. 11 is a flowchart illustrating an example of a process procedure of a refresh command process according to the first embodiment of the technology. In other words, the process procedure is a process procedure executed when the memory controller 200 receives a refresh command from the host computer 100.

First, the processor 240 determines whether the error information management table 221 has a valid entry (step S941). The valid entry is an entry in which the number of errors is not zero. When the error information management table 221 has no valid entry (No at the step S941), the processor 240 notifies the host computer 100 of normal completion of the refresh command process to terminate the refresh command process (step S949). On the other hand, when the error information management table 221 has valid entries (Yes at the step S941), the processor 240 executes the following processes.

The processor 240 selects a physical address to be refreshed from the valid entries (step S942). In the first embodiment, it is assumed that the process is executed in order of the physical address having the larger number of errors, and when the numbers of errors are the same between some physical addresses, the physical address to be refreshed is selected in ascending order of physical addresses.

The processor 240 specifies the physical address selected at the step S942 to read the data from the specified physical address of the memory 300, and transfers the read data to the error detection correction section 230 (step S943). At this time, the data size to be transferred is 528 bytes.

The error detection correction section 230 executes error detection on the 528-byte data transferred at the step S943, and when errors are detected, the error detection correction section 230 further executes error correction (step S944).

The 528-byte data including the 512-byte data corrected at the step S944 and the 16-byte ECC is transferred from the error detection correction section 230, and then written into the physical address selected at the step S942 of the memory 300 (step S946).

Then, the number of errors in the refreshed entry in the error information management table 221 is updated with "0", which makes the refreshed entry empty (step S948). After that, the processes at the step S941 and following steps are repeated.

Incidentally, the case where all valid entries in the error information management table 221 are refreshed is assumed in this example. However, the host computer 100 may specify a maximum number of entries at the time of executing the refresh command. In such a case, at the step S941, it is determined whether the number of entries that have been subjected to the processes at the step S943 to S948 is lower than the maximum number of entries, and whether there is an entry not subjected to the processes at the steps S943 to S948.

Figure 12:
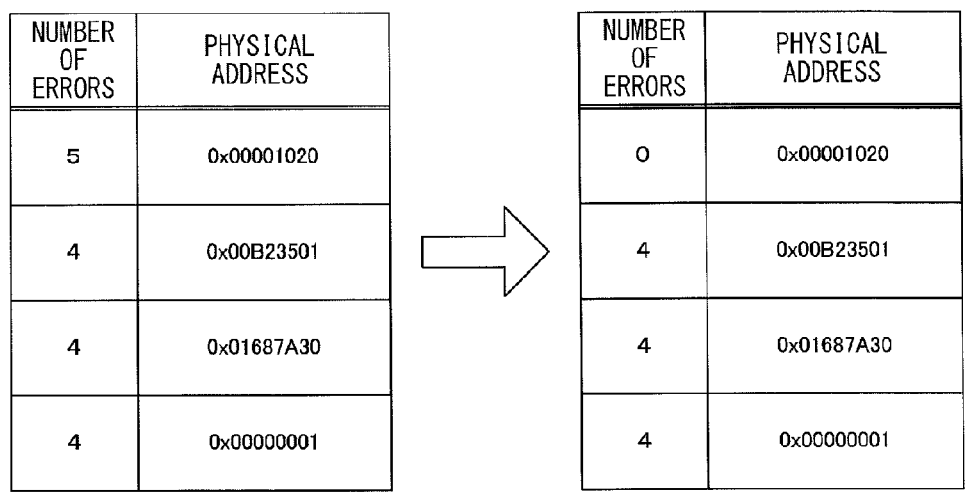
FIG. 12 is a diagram illustrating an example of the refresh command process according to the first embodiment of the technology.

FIG. 12 is a diagram illustrating an example of the refresh command process according to the first embodiment of the technology. In this example, it is found that a first entry is refreshed, and thus is updated to an empty entry.

(Execution Timing of Refresh Command)

An execution timing of the refresh command is determined by the host computer 100. Examples of the execution timing may include, periodical timing, timing before power shutdown, timing where the read command and the write command are not being executed by the host computer, and timing before the host computer shifts a low power consumption mode such as a sleep mode.

As information used by the host computer 100 for determining the execution timing of the refresh command, a state of the error information management table 221 may be notified to the host computer 100 at the time of end of the read command. For example, the number of valid entries in the error information management table 221, namely, the number of entries where the number of errors is not zero may be notified.

Notification of the number of valid entries enables the host computer 100 to issue a refresh command before the number of entries exceeds the number of entries (in the above-described example, four entries) manageable by the error information management table 221. In addition, the notification of the number of valid entries enables the host computer 100 to issue a refresh command only when the error information management table 221 has valid entries. Accordingly, it is possible to suppress overhead of the controller associated with the command process.

In addition, to reduce the number of notifications to the host computer 100, the host computer 100 may set a notification condition in the memory controller 200 in advance, and notification may be given only when the condition is satisfied. Examples of the method of setting the notification condition may include, for example, a method in which the host computer 100 sets the condition with use of a command or the like, and a method of setting the condition before the host computer 100 uses the memory system, for example, at the time of factory shipment. For example, in a case where a condition of "the number of valid entries is three or more" is set as the notification condition to the host computer 100, notification is given at the time of completion of the read command when the number of valid entries in the error information management table 221 becomes "three" or "four".

Incidentally, the description is given assuming a dedicated command for refreshment. However, when another command is received from the host computer 100, the refresh process described with reference to FIG. 11 may be executed in addition to execution of the command. For example, it is conceivable that when FLUSH CACHE command or FLUSH CACHE Ext command that is defined in ATA/ATAPI Command Set (ATA8-ACS) is received, the refresh process is executed in addition to execution of the command. In the example of ATA8-ACS, STANDBY IMMEDIATE command, SLEEP command, and the like may be used. In addition, SYNCHRONIZE CACHE command, START/STOP UNIT command, and the like that are defined in SCSI Block Commands-3 (SBC-3) may be used. Note that, in these cases, the process completion notification to the host computer 100 is given after the completion of the refresh process.

(Operation of Write Command Process)

Figure 13:
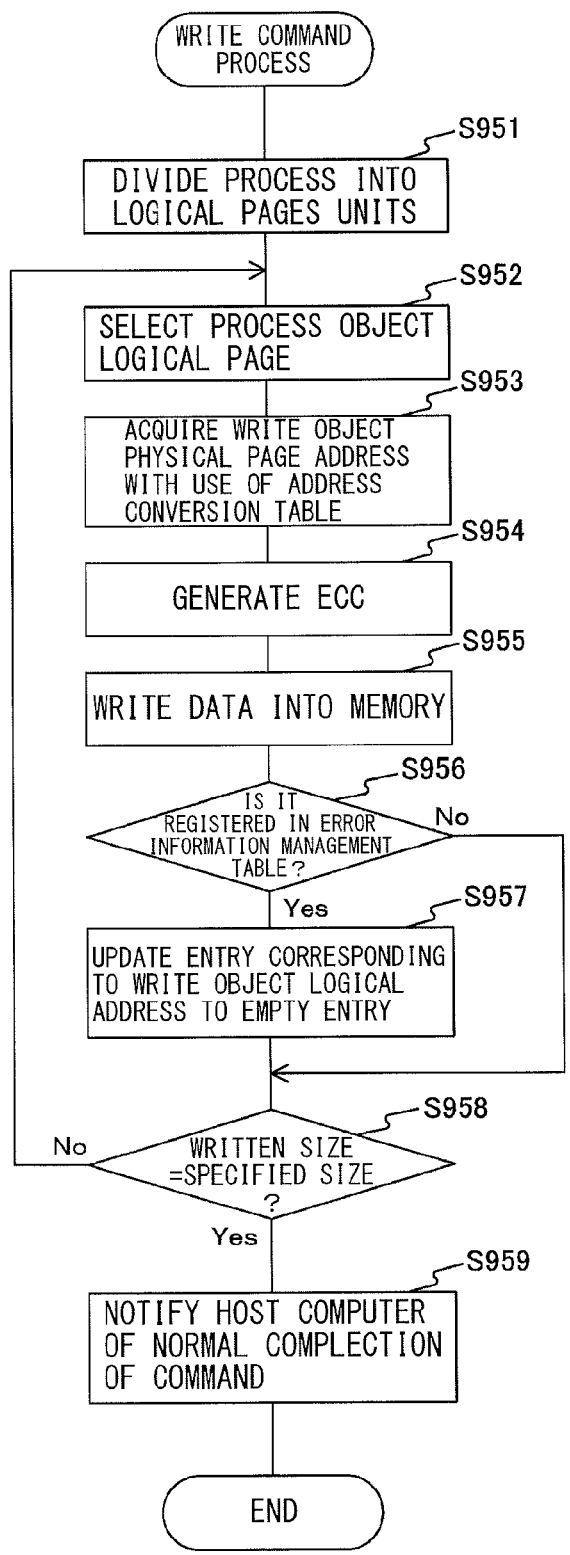
FIG. 13 is a flowchart illustrating an example of a process procedure of a write command process according to the first embodiment of the technology.

FIG. 13 is a flowchart illustrating an example of a process procedure of a write command process according to the first embodiment of the technology. In other words, the process procedure is a process procedure executed when the memory controller 200 receives a write command from the host computer 100.

The processor 240 divides the process into logical address units, based on a head logical address of a write object and a data size that are received by the host interface 201 (step S951). One logical address is processed by one process. For example, in a case where "0" is specified as the head address of the write object and "1" is specified as the data size, one process is executed. In a case where "0" is specified as the head logical address of the write object and "2" is specified as the data size, the process is divided into two processes.

The processor 240 selects and determines a logical address to be subjected to the write process (step S952). In the first embodiment, the logical address to be subjected to the write process is determined in order based on the head logical addresses of the respective write objects. In a case where "0" is specified as the head logical address specified by the write command and "2" is specified as the data size, the logical address to be subjected to the process first is determined to "0". The logical address to be subjected to the process subsequently is determined to "1".

The processor 240 converts the logical address selected at the step S952 into a physical address with use of the address conversion table 222 held in the table management section 220 (step S953).

The processor 240 transfers 512-byte data of one logical address received by the host interface 201, to the ECC generation section 210 (step S954). The ECC generation section 210 generates 16-byte ECC with respect to the received 512-byte data.

The processor 240 specifies the physical address obtained at the step S953 to write the 528-byte data transferred from the ECC generation section 210, into the specified physical address of the memory 300 (step S955).

The processor 240 determines whether the physical address obtained at the step S953 is registered on entries of the error information management table 221 (step S956). When the physical address is registered (Yes at the step S956), the processor 240 updates the number of errors in the entry where the physical address written at the step S955 is registered, with "0". As a result, the entry becomes an empty entry (step S957).

In the write command process, the processor 240 compares the sum of the size of the data written into the memory 300 with the data size specified by the write command (step S958). When the sum of the size of the written data is smaller than the specified data size (No at the step S958), the processes at the step S952 and following steps are repeated. On the other hand, when the sum of the size of the written data reaches the specified data size (Yes at the step S958), the processor 240 notifies the host computer 100 of normal completion of the write command process to terminate the write command process (step S959).

As described above, according to the first embodiment of the technology, it is possible to appropriately determine a refresh object address in the memory 300, based on the error information managed by the error information management table 221.

(Modification of Table Management Section)

Figure 14:
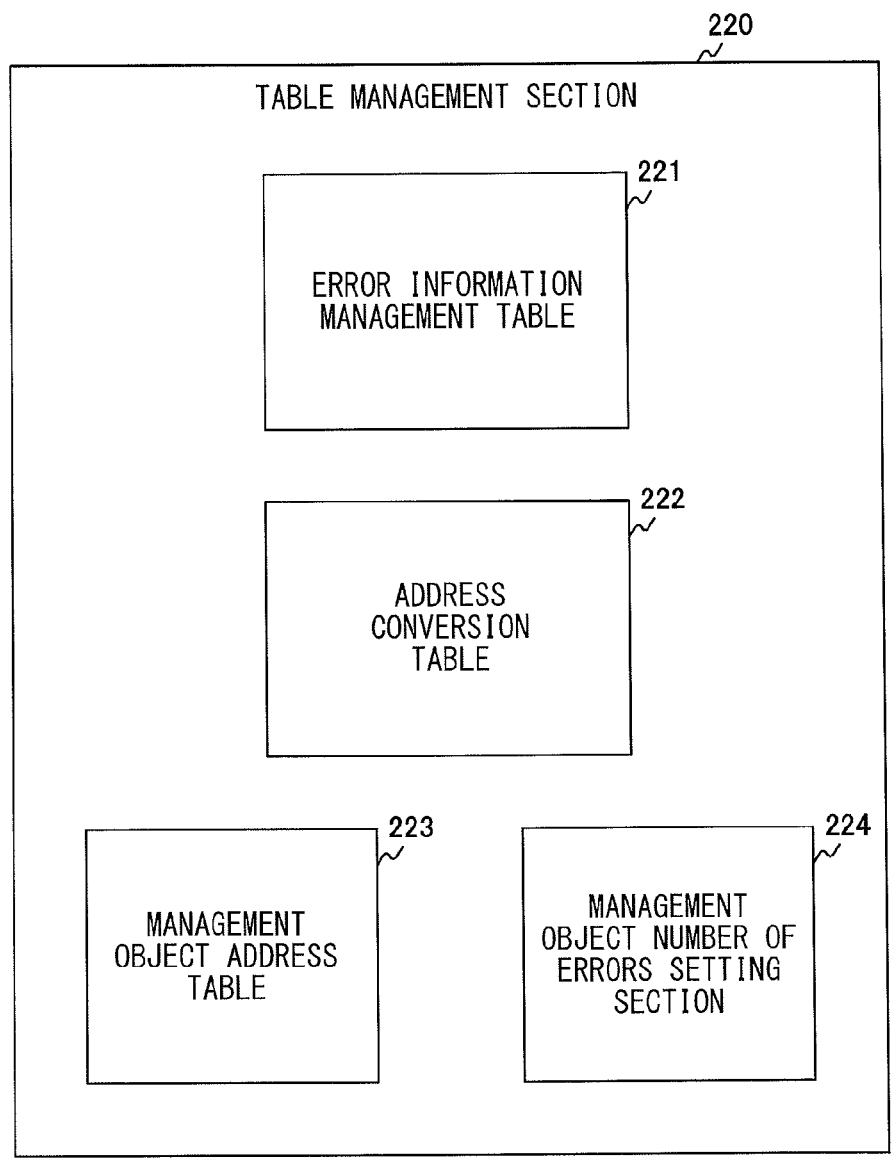
FIG. 14 is a diagram illustrating a configuration example of a table management section 220 according to a modification of the first embodiment of the technology.

FIG. 14 is a diagram illustrating a configuration example of a table management section 220 according to a modification of the first embodiment of the technology. The table management section 220 includes a management object address table 223 and a management object number-of-errors setting section 224, in addition to the error information management table 221 and the address conversion table 222.

The management object address table 223 is a table holding information for determining whether a logical address where errors are detected is a management object in the error information management table 221. The table is used, for example, when a certain logical address is excluded from management objects for refreshment due to the fact that the certain logical address is to be rewritten in the near term, and the like.

The management object number-of-errors setting section 224 holds a minimum value out of the numbers of errors to be managed in the error information management table 221. This is used in the case where a logical address where the number of errors is small is excluded from management objects. For example, when "3" is held in the management object number-of-errors setting section 224, control is performed so that a logical address where the number of detected errors is "1" or "2" is not managed by the error information management table 221.

Note that, although an example of a minimum value out of the numbers of errors to be managed is described, a maximum value out of the numbers of errors excluded from the management objects may be held.

FIG. 15 is a diagram illustrating a structure example of the management object address table 223 according to the modification of the first embodiment of the technology. The management object address table 223 holds logical addresses to be managed by the error information management table 221 when errors are detected. In other words, it is assumed that the logical addresses that are included in a range indicated by a size based on an address held as a start logical address by the management object address table 223 as the starting-point, are included in management objects by the error information management table 221. In the management object address table 223, the start logical address is addressed with a logical sector as a unit. As the logical sector, for example, 512 bytes is allowed to be assumed.

Incidentally, it is assumed here that the management object logical addresses are held in the error information management table 221. However, logical addresses that are excluded from management objects may be held in the error information management table 221.

Figure 16:
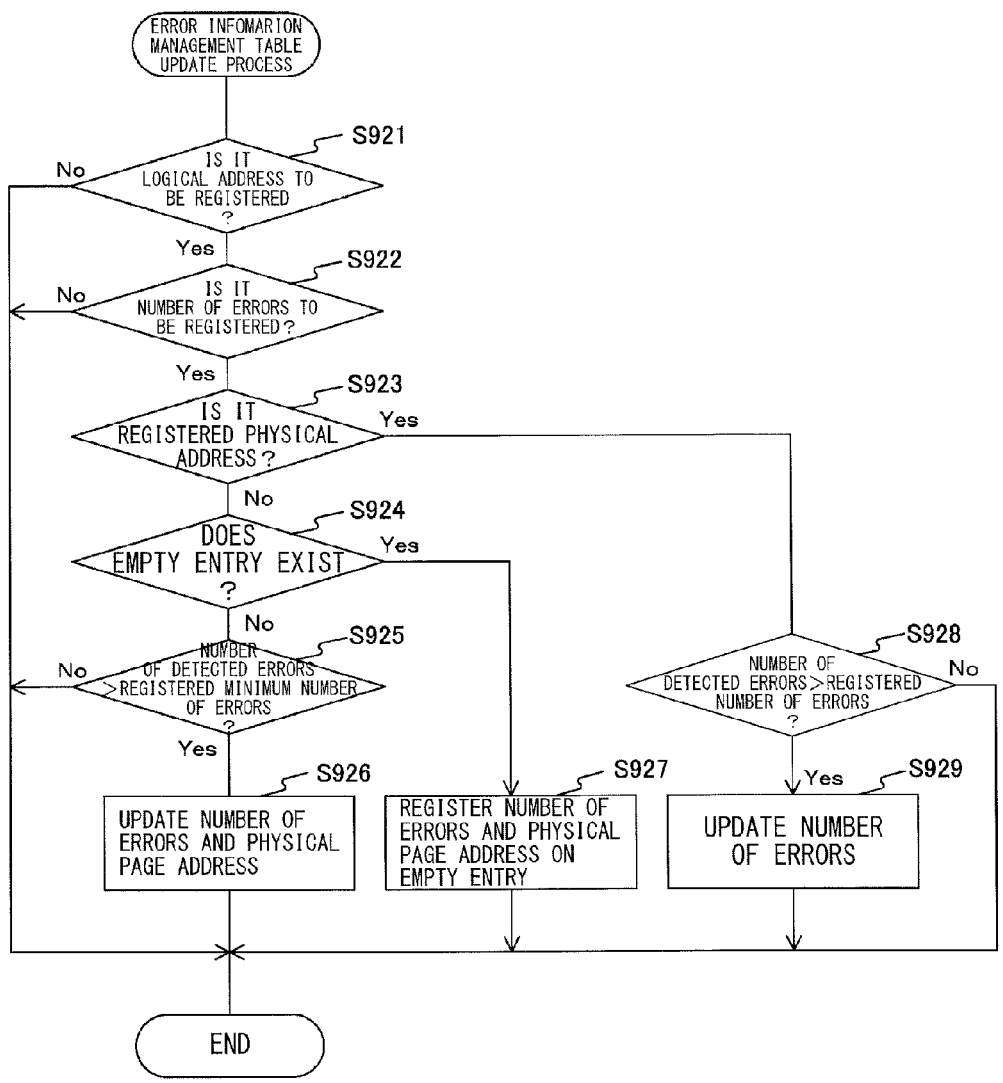
FIG. 16 is a flowchart illustrating an example of a process procedure of update of an error information management table according to the modification of the first embodiment of the technology.

FIG. 16 is a flowchart illustrating an example of a process procedure of update of the error information management table according to the modification of the first embodiment of the technology. The example of the process procedure in the modification is different from the example of the process procedure described with reference to FIG. 7 in that processes at steps S921 and S922 are added to the first stage of the process.

First, it is determined whether the logical address corresponding to the physical address where errors are detected is a management object logical address in the error information management table 221 (step S921). When the logical address corresponding to the physical address where errors are detected is not a management object (No at the step S921), the process is terminated without update of the error information management table 221.

Then, it is determined whether the number of detected errors is the management object number-of-errors in the error information management table 221 (step S922). When the number of detected errors is not a management object (No at the step S922), the process is terminated without update of the error information management table 221. The subsequent processes are similar to those in the example of the process procedure described with reference to FIG. 7.

Examples of the logical address specified when a specific logical address is excluded from management objects in the error information management table may include a logical address in which data is frequently written by the write command and refreshment is not necessary.

As a method of setting whether the logical address is included in management objects, first, a method in which the host computer 100 specifies whether a certain logical address is included in management objects by the error information management table 221 with use of a command and the like is conceivable. Moreover, second, a method in which, as a parameter of the read command, a flag for distinguishing whether the logical address subjected to the read command process is included in the management objects is defined, and the host computer 100 specifies the logical address with use of the flag at the time of executing the read command is conceivable. Furthermore, third, a method of specifying whether the logical address is included in the management objects before the host computer 100 uses the memory system, for example, at the time of factory shipment.

As an example of the case in which the physical page where the number of detected errors is small is excluded from the management objects by the error information management table 221, it is conceivable that the physical page where the number of detected errors is 1 bit or 2 bit or less is excluded from the management objects. This is effective in the case where 1-bit or 2-bit error frequently occurs due to influence of noise or the like at the time of reading.

As a method of setting whether the number of detected errors is included in the management objects, first, a method in which the host computer 100 specifies the management object number-of-errors with use of a command or the like is conceivable. Second, a method in which "management object number-of-errors" is defined as a parameter that is allowed to be specified by the read command, and the host computer 100 specifies the parameter to execute the read command is conceivable. In addition, third, a method of specifying the management object number-of-errors before the host computer 100 uses the memory system, for example, at the time of factory shipment.

As described above, according to the present modification, it is possible to previously specify the condition of the error information to be managed in the error information management table 221.

(Modification of Error Information Management Table)

FIG. 17 is a diagram illustrating a structure example of an error information management table 221 according to a modification of the first embodiment of the technology. The error information management table 221 further holds the number of reading times in each entry, in addition to that described with reference to FIG. 4. The priority order for refreshment may be determined in order of the larger number of reading times.

The number of reading times is set to "1" at the time when a physical address is registered on the error information management table 221. The number of reading times is incremented in the case where a physical address to be read by the read command is a registered physical address.

As described above, according to the present modification, it is possible to determine a refresh object address in the memory 300, based on the number of reading times managed in the error information management table 221.

(Modification of Refresh Command Process)

In the case of a non-volatile memory not allowing overwriting of physical address where errors occur, it is necessary to change a physical address of writing destination at the time of refreshment. In addition, there is a case where the change of a physical address of writing destination is desired at the time of refreshment even in the case of a non-volatile memory allowing overwriting. In this case, a flag may be provided in a refresh command, and the host computer 100 may instruct the memory controller 200 to change a physical address of writing destination. Moreover, the memory controller 200 may autonomously change a physical address of writing destination at the time of refreshment. When a physical address of writing destination is changed at the time of refreshment in such a way, contents of the refresh command process are different as described below.

Figure 18:
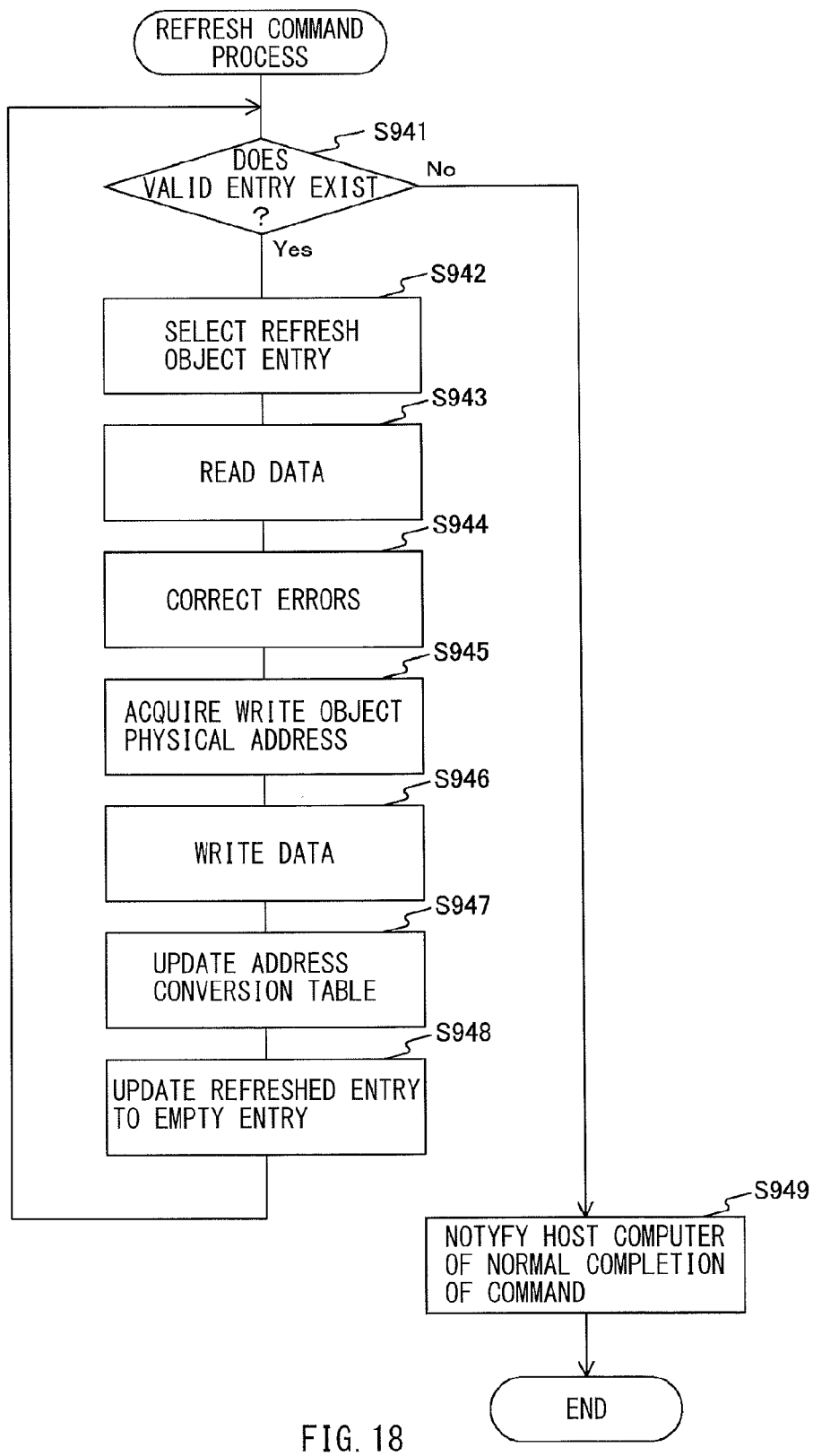
FIG. 18 is a flowchart illustrating an example of a process procedure of a refresh command process according to a modification of the first embodiment of the technology.

FIG. 18 is a flowchart illustrating an example of a process procedure of a refresh command process according to a modification of the first embodiment of the technology. The example of the process procedure in the present modification is different in processes at the steps S945 to S947 from the example of the process procedure described with reference to FIG. 11.

After the error correction is executed (step S944), data-writable physical address is searched in the memory 300, and the detected physical address is selected (step S945). Then, when the 528-byte data including 512-byte data corrected at the step S944 and the 16-byte ECC is transferred from the error detection correction section 230, the physical address selected at the step S945 is specified and data is written into the specified physical address of the memory 300 (step S946). Then, in this case, since the physical address has been changed, the address conversion table 222 is updated (step S947). In other words, the value of the physical address selected at the step S942 is updated with the physical address selected at the step S945. Other processes are similar to those in the example of the process procedure described with reference to FIG. 11.

As described above, according to the present modification, it is possible to change the physical address of the writing destination at the time of refreshment.

(2Second Embodiment)

In the above-described first embodiment, a plurality of entries in which the physical address of the memory 300 where errors occur and the number of detected errors are paired are held. However, the logical address of the memory 300 may be used. In a second embodiment, the logical address of the memory 300 is used to manage error information.

(Structure of Error Information Management Table)

FIG. 19 is a diagram illustrating a structure example of an error information management table 221 according to the second embodiment of the technology. The error information management table 221 according to the second embodiment holds a plurality of entries in which a logical address of the memory where errors occur and the number of detected errors are paired.

(Operation of Read Command Process)

In the second embodiment of the technology, although error information is managed with use of a logical address of the memory 300, the operation of the read command process is basically similar to that described with reference to FIG. 6 and FIG. 7 except that a logical page is registered in the following manner in the update of the error information management table 221 (step S920).

Figure 20:
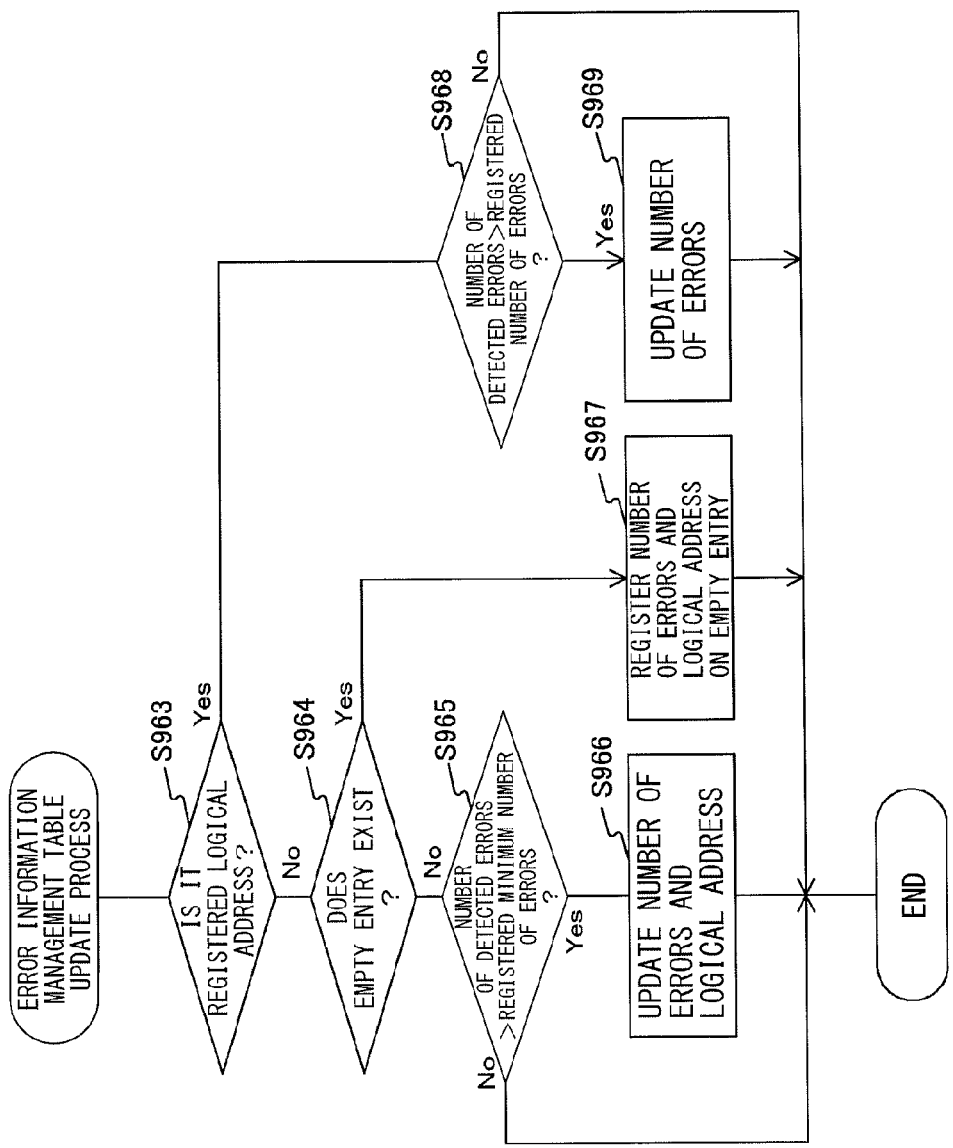
FIG. 20 is a flowchart illustrating an example of a process procedure of update of the error information management table according to the second embodiment of the technology.

FIG. 20 is a flowchart illustrating an example of a process procedure of update of the error information management table 221 according to the second embodiment of the technology.

First, it is determined whether a logical address where errors are detected at the step S915 is a logical address registered on the error information management table 221 (step S963). When the logical address where errors are detected is the registered logical address (Yes at the step S963), it is determined whether the number of detected errors is larger than the registered number of errors (step S968). When the number of detected errors is larger than the registered number of errors (Yes at the step S968), the number of errors in the corresponding entry in the error information management table 221 is updated with the number of detected errors (step S969).

When the logical address where errors are detected is not registered on the error information management table 221 (No at the step S963), it is determined whether the error information management table 221 has an empty entry (step S964). When the error information management table 221 has an empty entry (Yes at the step S964), the logical address where error are detected and the number of errors are registered on the empty entry (step S967).

On the other hand, when the error information management table 221 has no empty entry (No at the step S964), the number of detected errors is compared with a minimum value out of the numbers of errors registered on the respective entries (step S965). When the number of detected errors is larger the minimum value (Yes at the step S965), the entry having the minimum value is updated with the number of detected errors and the logical address where the errors are detected (step S966).

(Operation of Refresh Command Process)

In the second embodiment of the technology, although error information is managed with use of the logical address of the memory 300, the operation of the refresh command process is basically similar to that described with reference to FIG. 11 except that, at the step S942, a logical address to be refreshed is selected from the valid entries and is converted into a corresponding physical address with use of the address conversion table 222. In the second embodiment, a logical address where the number of errors is large is selected. In addition, it is assumed that when the numbers of errors are the same between some logical addresses, the logical address to be refreshed is selected in ascending order of logical addresses.

(Operation of Write Command Process)

In the second embodiment of the technology, although error information is managed with use of the logical address of the memory 300, the operation of the write command process is basically similar to that described with reference to FIG. 13 except that, at the step S957, the processor 240 updates the number of errors in the entry where the logical address subjected to the writing at the step S955, with "0", and makes the entry empty.

As described above, according to the second embodiment of the technology, it is possible to appropriately determine a refresh object address in the memory 300, based on error information managed by a logical address in the error information management table 221.

(3Third Embodiment)

In the above-described first embodiment, entries in which the physical address of the memory 300 where errors occur and the number of detected errors are paired are held in the error information management table 221. In a third embodiment, read data is further held and managed in the error information management table 221. When read data read from the memory 300 is managed in the error information management table 221, process time of refresh command is reduced because data reading from the memory is not executed in the refresh command process.

(Structure of Error Information Management Table)

FIG. 21 is a diagram illustrating a structure example of an error information management table 221 according to the third embodiment of the technology. The error information management table 221 according to the third embodiment holds a plurality of entries in which a logical address of the memory 300 where errors occur, the number of detected errors, and read data read from the memory 300 are associated with one another. In this case, 528-byte read data including 512-byte data and 16-byte ECC is assumed.

(Operation of Read Command Process)

In the third embodiment of the technology, although 528-byte data is held in the error information management table 221, the operation of the read command process is basically similar to that described with reference to FIG. 6 and FIG. 7 except that the processes at the steps S926 and S927 are different as described below.

Specifically, at the step S926, the number of detected errors and the physical address thereof are updated in the entry, and the corrected 528-byte data is held in the error information management table 221.

In addition, at the step S927, the physical address of the detected errors and the number of detected errors are registered on an empty entry, and the corrected 528-byte data is held in the error information management table 221.

(Operation of Refresh Command Process)

In the third embodiment of the technology, although the 528-byte data is held in the error information management table 221, the operation of the refresh command process is basically similar to that described with reference to FIG. 11 except that the processes at the steps S943 to S946 are different as described below.

Specifically, since the corrected data is held in the error information management table 221, the processes of reading data from the memory 300 and then correcting error at the steps S943 and S944 are unnecessary.

In addition, at the step S946, data held in the error information management table 221 is transferred, the physical address selected at the step S942 is specified, and the data is then written into the specified physical address of the memory 300.

(Operation of Write Command Process)

In the third embodiment of the technology, although the 528-byte data is held in the error information management table 221, the operation of the write command process is basically similar to that described with reference to FIG. 13.

As described above, according to the third embodiment of the technology, the corrected 528-byte data is held in the error information management table 221, which makes it possible to eliminate data reading from the memory 300. As a result, it is possible to reduce process time for the refresh command process.

(4Fourth Embodiment)

In the above-described third embodiment, the 528-byte data including the 512-byte data and the 16-byte ECC is held in the error information management table 221. In a fourth embodiment, data excluding the ECC is held and managed by the error information management table 221. When the read data read from the memory 300 is managed by the error information management table 221, the process time for refresh command is reduced as with the third embodiment because data reading from the memory 300 is not executed at the time of the refresh command process.

(Structure of Error Information Management Table)

FIG. 22 is a diagram illustrating a structure example of an error information management table 221 according to a fourth embodiment of the technology. The error information management table 221 according to the fourth embodiment of the technology includes a plurality of entries in which the logical address of the memory 300 where errors occur, the number of detected errors, and the read data read from the memory 300 are associated with one another. In this example, 512-byte read data excluding the ECC is assumed.

(Operation of Read Command Process)

In the fourth embodiment of the technology, although 512-byte data is held in the error information management table 221, the operation of the read command process is basically similar to that described with reference to FIG. 6 and FIG. 7 except that the processes at the steps S926 and S927 are different as described below.

Specifically, at the step S926, the entry having the minimum value is updated with the number of detected errors and the physical address thereof, and the corrected 512-byte data is held in the error information management table 221.

Moreover, at the step S927, the physical address of the detected errors and the number of errors are registered on the empty entry, and the corrected 512-byte data is held in the error information management table 221.

(Operation of Refresh Command Process)

In the fourth embodiment of the technology, although the 512-byte data is held in the error information management table 221, the operation of the refresh command is basically similar to that described with reference to FIG. 11 except that the processes in the ECC generation procedure and data writing procedure are different as described below.

Figure 23:
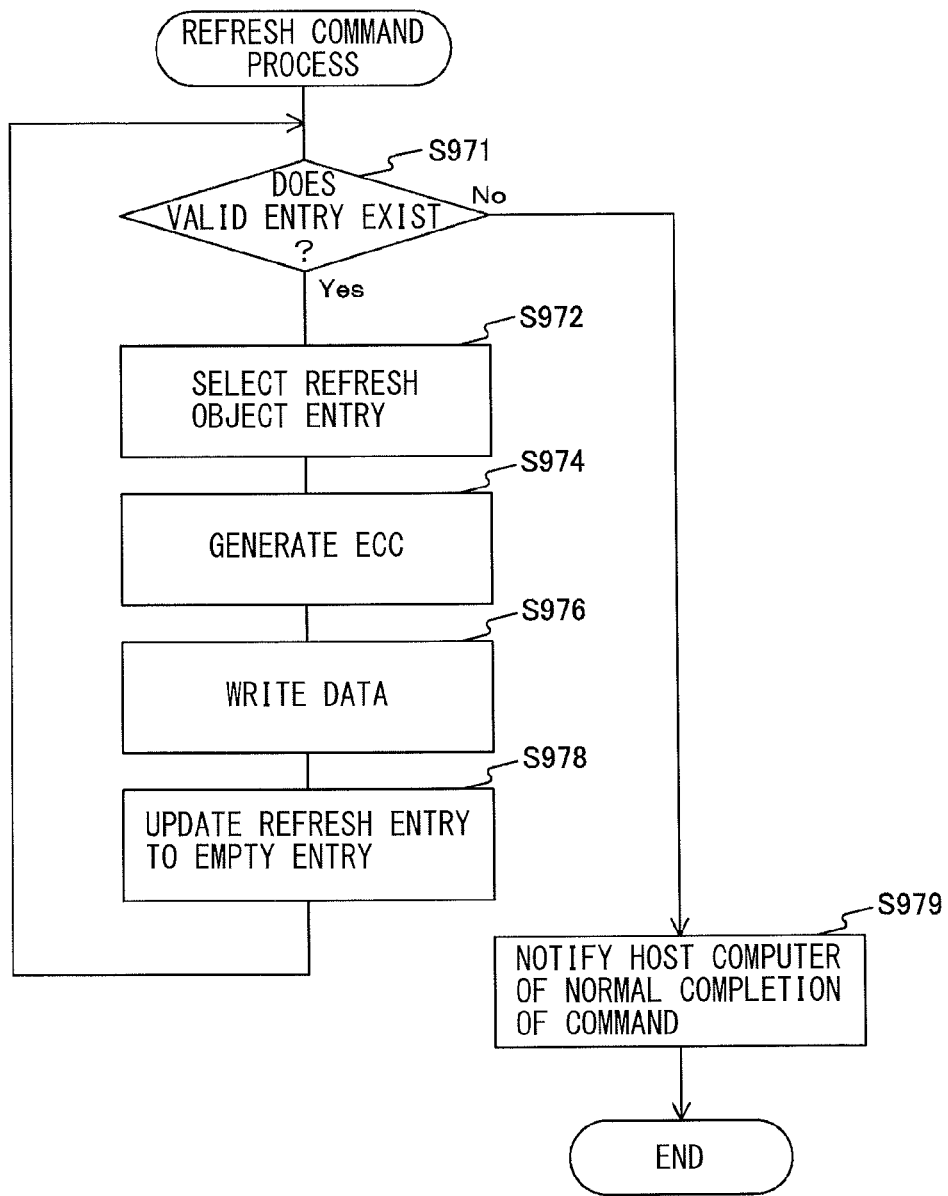
FIG. 23 is a flowchart illustrating an example of a process procedure of a refresh command process according to the fourth embodiment of the technology.

FIG. 23 is a flowchart illustrating an example of a process procedure of the refresh command process in the fourth embodiment of the technology.

First, the processor 240 determines whether the error information management table 221 has a valid entry (step S971). The valid entry is an entry in which the number of errors is not zero. When the error information management table 221 has no valid entry (No at the step S971), the processor 240 notifies the host computer 100 of normal completion of the refresh command process to terminate the refresh command process (step S979). On the other hand, when the error information management table 221 has valid entries (Yes at the step S971), the processor 240 executes the following processes.

The processor 240 selects a physical address to be refreshed from the valid entries (step S972). In the fourth embodiment, it is assumed that the process is executed in order of the physical address having the larger number of errors, and when the numbers of errors are the same between some physical addresses, the physical address to be refreshed is selected in ascending order of physical addresses.

The processor 240 transfer the 512-byte data from the table management section 220 to the ECC generation section 210, and the ECC generation section 210 then generates 16-byte ECC with respect to the received 512-byte data (step S974).

The processor 240 specifies the physical address selected at the step S972 to write the 528-byte data transferred from the ECC generation section 210, into the specified physical address of the memory 300 (step S976).

Then, the number of errors in the refreshed entry in the error information management table 221 is updated with "0", which makes the refreshed entry empty (step S978). After that, the processes at the step S971 and following steps are repeated.

(Operation of Write Command Process)

In the fourth embodiment of the technology, although the 512-byte data is held in the error information management table 221, the operation of the write command process is basically similar to that described with reference to FIG. 13.

As described above, according to the fourth embodiment of the technology, the corrected 512-byte data is held in the error information management table 221, which makes it possible to eliminate data reading from the memory 300. As a result, it is possible to reduce process time for the refresh command process.

(5Fifth Embodiment)

In the above-described third or fourth embodiment, data are held in all of the entries of the error information management table 221. In a fifth embodiment, data only for a physical page in which the number of detected errors is large is held. In the physical page in which a large number of errors occur, uncorrectable error may occur in reading the data in the near term. Therefore, for such a physical page, the data is held as it is to be used in the subsequent read operation. An effect of a so-called cache memory is intended. As a result, it is possible to prevent uncorrectable error to ensure high reliability while reducing the size of the error information management table 221.

(Structure of Error Information Management Table)

FIG. 24 is a diagram illustrating a structure example of an error information management table 221 according to the fifth embodiment of the technology. In the error information management table 221 according to the fifth embodiment, only data of a physical address where the number of occurred errors is 6 bits or more is held in a corresponding entry. In other words, control is performed so that data is not held in an entry where the number of occurred errors is less than 6 bits.

(Operation of Read Command Process)

In the fifth embodiment of the technology, although data only for a physical page where the number of detected errors is large is held in the error information management table 221, the operation of the read command process is basically similar to that described with reference to FIG. 6 and FIG. 7 except that the error information update process is different as described below.

Figure 25:
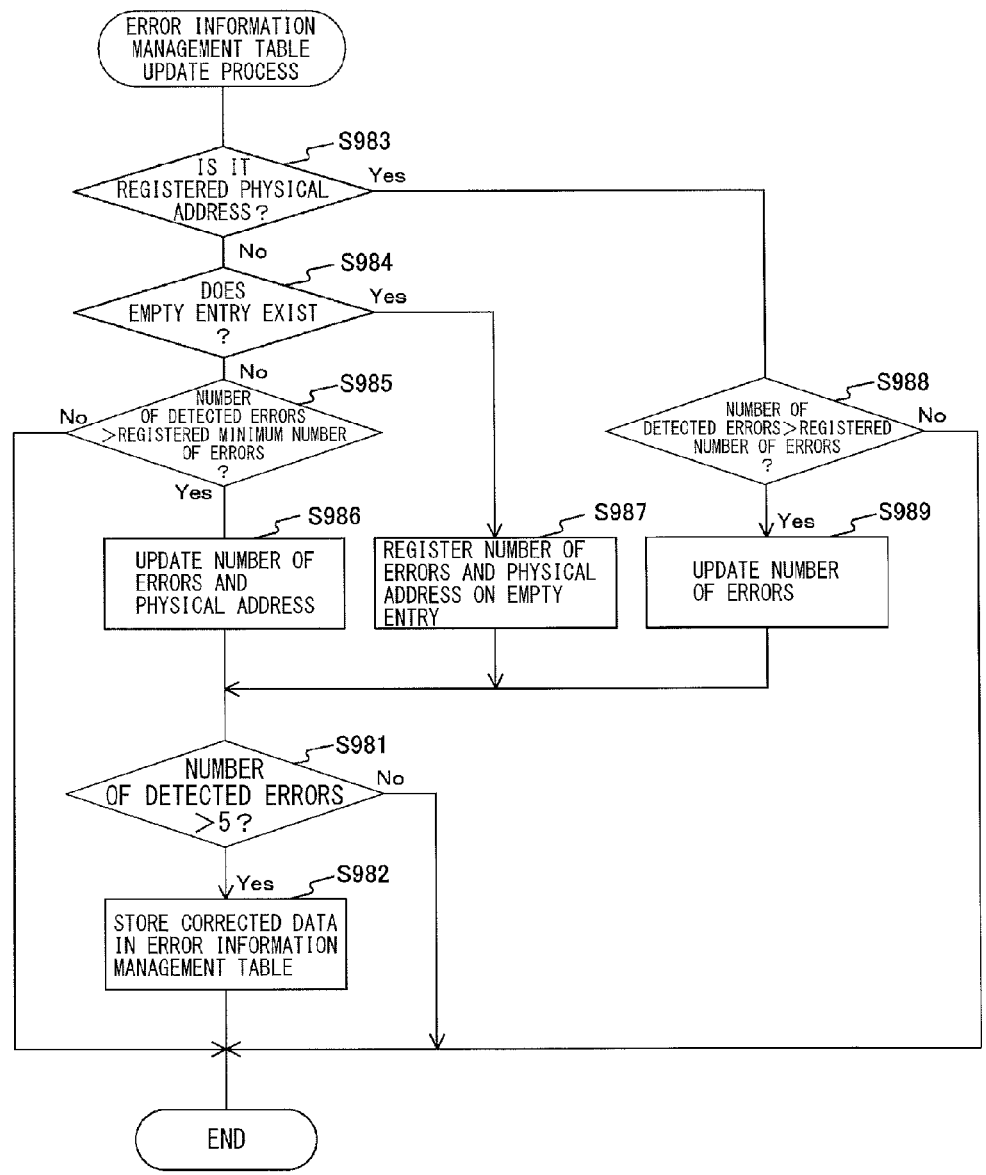
FIG. 25 is a flowchart illustrating an example of a process procedure of update of the error information management table according to the fifth embodiment of the technology.

FIG. 25 is a flowchart illustrating an example of a process procedure of the update of the error information management table in the fifth embodiment of the technology.

First, it is determined whether the physical address where errors are detected at the step S915 is a physical address registered on the error information management table 221 (step S983). When the physical address where errors are detected is the registered physical address (Yes at the step S983), it is determined whether the number of detected errors is larger than the registered number of errors (step S988). When the number of detected errors is larger than the registered number of errors (Yes at the step S988), the number of errors in the corresponding entry of the error information management table 221 is updated with the number of detected errors (step S989).

When the physical address where errors are detected is not registered on the error information management table 221 (No at the step S983), it is determined whether the error information management table 221 has an empty entry (step S984). When the error information management table 221 has an empty entry (Yes at the step S984), the physical address where errors are detected and the number of detected errors are registered on the empty entry (step S987).

On the other hand, when the error information management table 221 has no empty entry (No at the step S984), the number of the detected errors is compared with a minimum value out of the numbers of errors registered on the respective entries (step S985). When the number of detected errors is larger than the minimum value (Yes at the step S985), the entry having the minimum value is updated with the number of detected errors and the physical address thereof (step S986).

After the registration or the update of the error information management table 221 is executed at the step S986, S987, or S989, it is determined whether the number of detected errors exceeds "5" (step S981). As a result, when the number of detected errors exceeds "5" (Yes at the step S981), the data corrected by the error detection correction section 230 is held in the error information management table 221 (step S982).

(Operation of Refresh Command Process)

In the fifth embodiment of the technology, although data only for a physical page where the number of detected errors is large is held in the error information management table 221, the operation of the refresh command process is basically similar to that described with reference to FIG. 11 except that the process in the data read procedure is different as described below.

Figure 26:
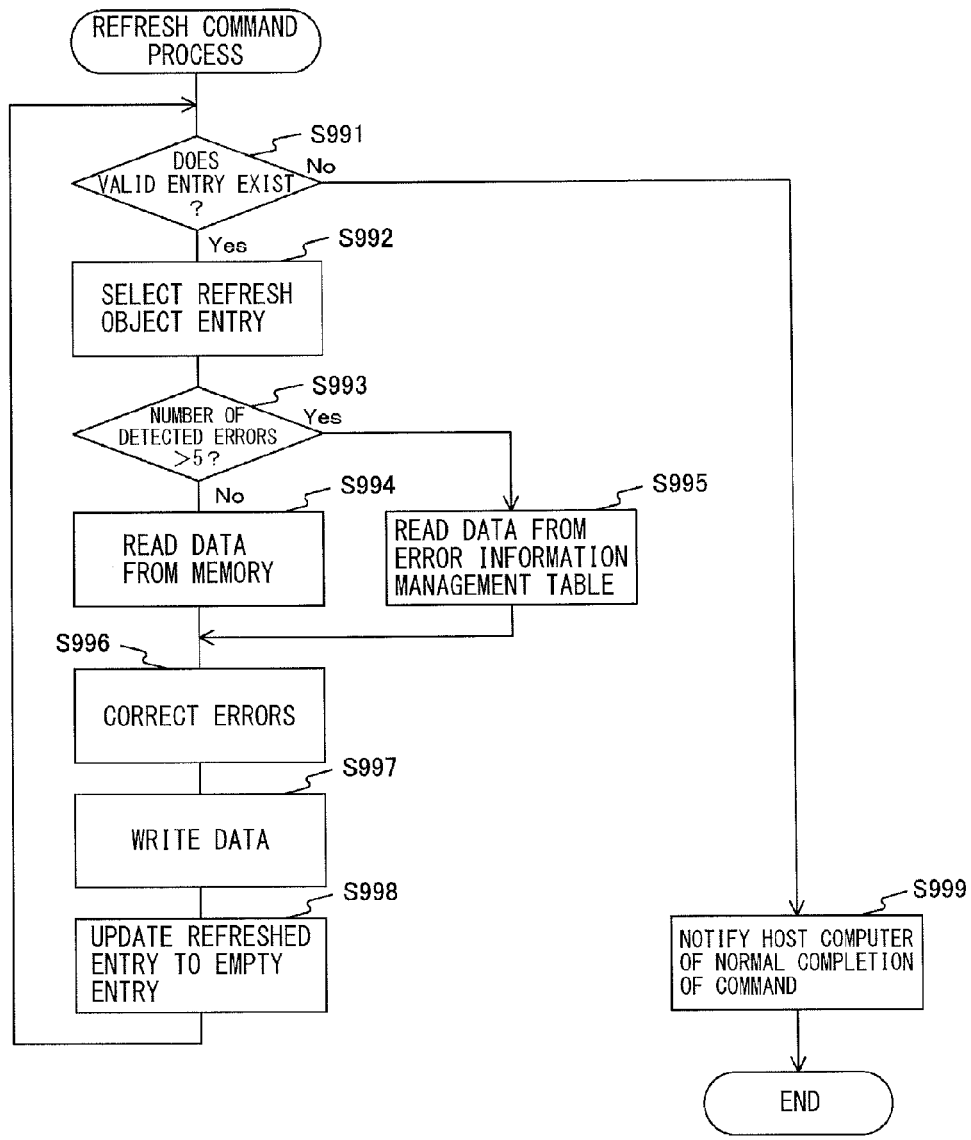
FIG. 26 is a flowchart illustrating an example of a process procedure of a refresh command process according to the fifth embodiment of the technology.

FIG. 26 is a flowchart illustrating an example of a process procedure of the refresh command process according to the fifth embodiment of the technology.

First, the processor 240 determines whether the error information management table 221 has a valid entry (step S991). The valid entry is an entry where the number of errors is not zero. When the error information management table 221 has no valid entry (No at the step S991), the processor 240 notifies the host computer 100 of normal completion of the refresh command process to terminate the refresh command process (step S999). On the other hand, when the error information management table 221 has valid entries (Yes at the step S991), the processor 240 executes the following processes.

The processor 240 selects a physical address to be refreshed from the valid entries (step S992). In the fifth embodiment, it is assumed that the process is executed in order of the physical address having the larger number of errors, and when the numbers of errors are the same between some physical addresses, the physical address to be refreshed is selected in ascending order of physical addresses.

When the number of errors corresponding to the physical address selected at the step S992 does not exceed "5" (No at the step S993), the physical address is specified, and data is read from the specified physical address of the memory 300 to be transferred to the error detection correction section 230 (step S994). At this time, the data size to be transferred is 528 bytes. On the other hand, when the number of errors corresponding to the physical address selected at the step S992 exceeds "5" (Yes at the step S993), the data held in the error information management table 221 is read without access to the memory 300 (step S995).

The error detection correction section 230 executes error detection of the read 528-byte data, and when error is detected, the error detection correction section 230 further executes error correction (step S996).

The 528-byte data including the 512-byte data corrected at the step S996 and the 16-byte ECC is transferred from the error detection correction section 230, and the physical address selected at the step S952 is specified, and the 528-byte data is written into the specified physical address of the memory 300 (step S997).

Then, the number of errors in the refreshed entry in the error information management table 221 is updated with "0", which makes the entry empty (step S998). After that, the processes at the step S991 and following steps are repeated.

(Operation of Write Command Process)

In the fifth embodiment of the technology, although data only for a physical page where the number of detected error is large is held in the error information management table 221, the operation of the write command process is basically similar to that described with reference to FIG. 13.

As described above, according to the fifth embodiment of the technology, it is possible to prevent uncorrectable error to ensure high reliability while reducing the size of the error information management table 221 as well as it is possible to reduce process time for the refresh command process.

(6Sixth Embodiment)

In the above-described first embodiment, the error information is managed by the memory controller 200 and the contents thereof are not notified to the host computer 100. However, the host computer 100 may have a function of acquiring the error information. As a result, it is possible to specify the number of entries to be refreshed actually, and the host computer 100 is allowed to estimate a time necessary for completing the refresh command in advance. It is expected for the host computer 100 to perform effective scheduling of commands to be executed by the memory system. Further, in the system in which a plurality of memory controllers and a plurality of memories are connected to the host computer 100, the host computer 100 is allowed to grasp the state of each memory controller. In other words, the host computer 100 is allowed to perform allocation of data to be stored, after scrutinizing information notified from the respective memory controllers and considering the states of the memories managed by the respective memory controllers.

In the sixth embodiment, the host computer 100 includes a table information acquiring command for acquiring information of the error information management table 221. It is assumed that the number of all entries in the error information management table 221, the number of entries where data is registered on the error information management table 221, a list of the number of errors and corresponding logical addresses, and the like are allowed to be acquired by the table information acquiring command. In this case, information such as the number of entries to be refreshed, the minimum value out of the numbers of errors to be refreshed, a logical address to be refreshed may be specified as parameters by the refresh command.

Incidentally, in the above-described first embodiment, the memory controller 200 executes the refreshment in priority order of physical addresses depending on the number of occurred errors. However, the host computer 100 may specify the logical address to execute the refreshment. Specifying logical address enables the host computer 100 to execute the refreshment of necessary data preferentially, irrespective of the number of occurred errors. As data to be refreshed irrespective of the number of errors, for example, management information of a file system in a memory system, and the like are assumed.

The sixth embodiment is different from the first embodiment in that the table information acquiring command is added and the refresh command process is different. These different points are described below.

(Operation of Table Information Acquiring Command Process)

Figure 27:
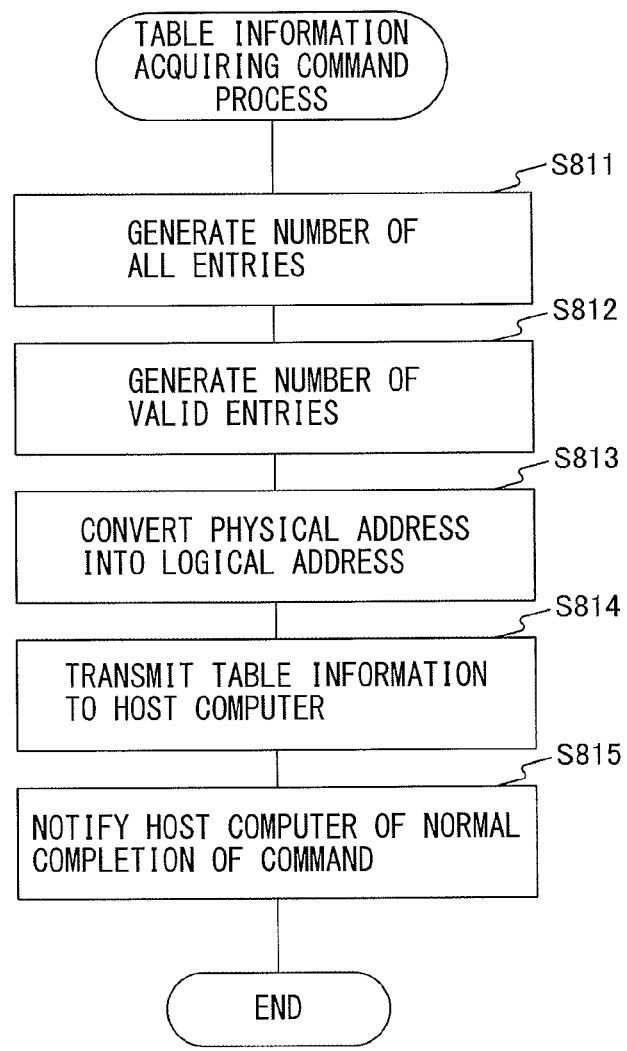
FIG. 27 is a flowchart illustrating an example of a process procedure of a table information acquiring command process according to a sixth embodiment of the technology.

FIG. 27 is a flowchart illustrating an example of a process procedure of a table information acquiring command process according to the sixth embodiment of the technology.

The processor 240 counts the number of all entries in the error information management table 221 (step S811). In the example of the error information management table 221 in FIG. 4, the number of all entries is "4".

The processor 240 counts the number of valid entries in the error information management table 221 (step S812). In the example of the error information management table 221 in FIG. 4, the number of valid entries is "3".

The processor 240 uses the address conversion table 222 to convert the physical addresses of the respective valid entries into logical addresses (step S813).

Then, the processor 240 transmits the error information to the host computer 100 (step S814). At this time, the error information includes the number of all entries obtained at the step S811, the number of valid entries obtained at the step S812, the logical addresses obtained at the step S813, and the number of errors obtained from the error information management table 221.

After that, the processor 240 notifies the host computer 100 of normal completion of the table information acquiring command process (step S815).

(Operation of Refresh Command Process)

Figure 28:
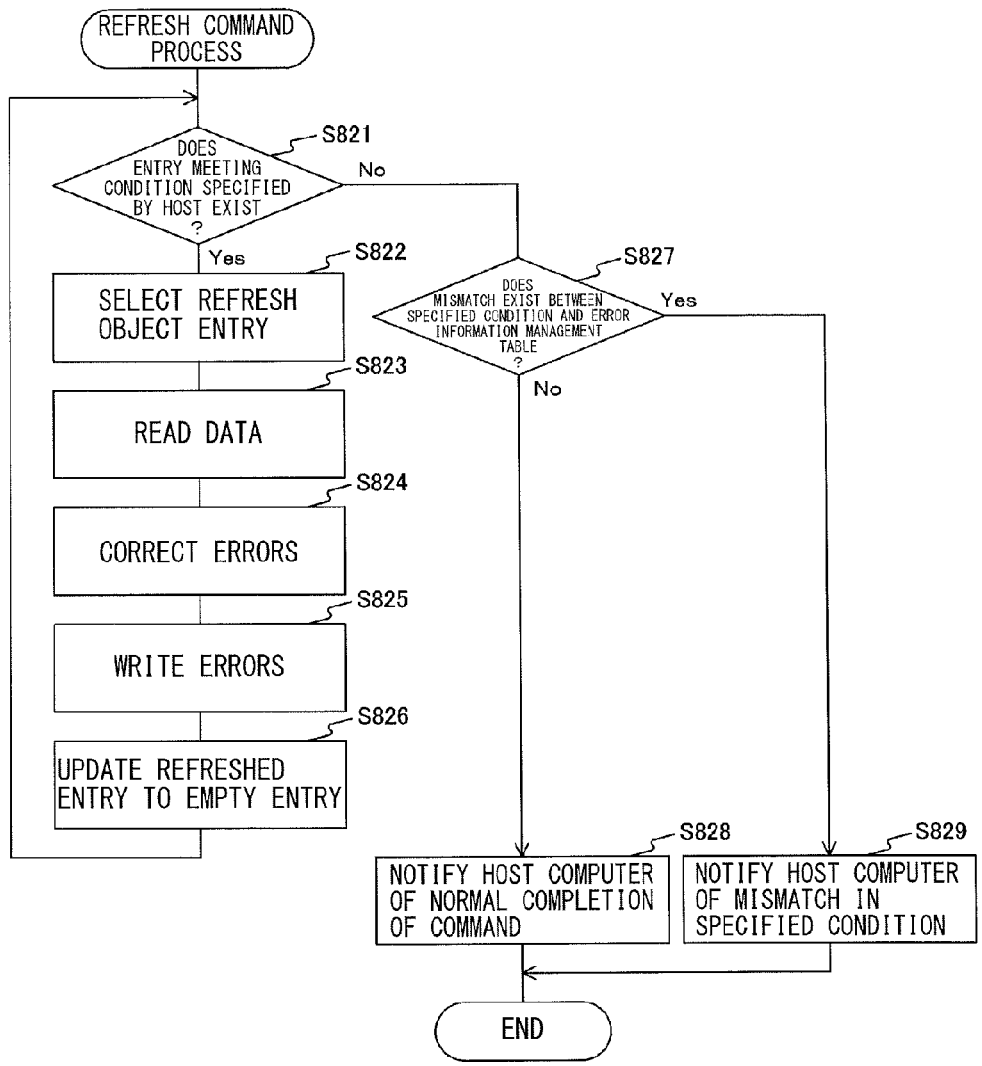
FIG. 28 is a flowchart illustrating an example of a process procedure of a refresh command process according to the sixth embodiment of the technology.

FIG. 28 is a flowchart illustrating an example of a process procedure of the refresh command process according to the sixth embodiment of the technology.

The processor 240 determines whether the error information management table 221 has an entry that meets a condition specified by the host computer 100 (step S821). When the error information management table 221 has an entry meeting the condition (Yes at the step S821), the processor 240 executes the processes at the step S822 and following steps. When the error information management table 221 has no entry meeting the condition (No at the step S821), the processor 240 executes the processes at the step S827 and following steps.

When the host computer 100 specifies the number of entries to be refreshed at the step S821, entries that have been subjected to the processes at the steps S823 to S826 are counted, and it is determined whether the number of counted entries is equal to the specified number of entries. When both are not equal to each other, namely, when the number of entries that have been subjected to the processes at the steps S823 to S826 is lower than the specified number of entries, it is determined that the error information management table 221 has the entry meeting the condition specified by the host, and the processor 240 executes the processes at the step S822 and following steps. In addition, when the host computer 100 specifies a minimum value of the number of errors to be refreshed at the step S821, the processor 240 executes the refresh process on the entry where the number of errors is equal to or larger than the specified number of errors. Moreover, when the host computer 100 specifies the logical address to be refreshed at the step S821, the processor 240 converts the physical addresses of the error information management table 221 into logical addresses. Then, it is determined whether there is a logical address matching the specified logical address.

When the error information management table 221 has an entry meeting the condition at the step S821 (Yes at the step S821), the processor 240 executes the following processes. The processor 240 selects a physical address to be refreshed from the valid entries (step S822). In the sixth embodiment, it is assumed that the process is executed in order of the physical address having the larger number of errors, and when the numbers of errors are the same between some physical addresses, the physical address to be refreshed is selected in ascending order of physical addresses.

The processor 240 specifies the physical address selected at the step S822 to read data from the memory 300, and then transfers the read data to the error detection correction section 230 (step S823). At this time, the size of the data to be transferred is 528 bytes.

The error detection correction section 230 executes error detection of the 528-byte data transferred at the step S823, and when errors are detected, the error detection correction section 230 executes error correction (step S824).

The 528-byte data including the 512-byte data corrected at the step S824 and the 16-byte ECC is transferred from the error detection correction section 230, the physical address selected at the step S822 is specified, and the 528-byte data is written into the specified physical address of the memory 300 (step S825).

Then, the number of errors in the refreshed entry in the error information management table 221 is updated with "0", which makes the entry empty (step S826). After that, the processes at the step S821 and following steps are repeated.

When the error information management table 221 has no entry meeting the condition at the step S821 (No at the step S821), the processor 240 executes the following processes. The processor 240 determines whether a mismatch exists between the condition specified by the host computer 100 and the error information management table 221 (step S827). When no mismatch exists (No at the step S827), the processor 240 notifies the host computer 100 of normal completion of the refresh command process to terminate the refresh command process (step S828). When a mismatch exists (Yes at the step S827), the processor 240 notifies the host computer 100 of a mismatch in the specified condition to terminate the refresh command process (step S829). When the entry that has been subjected to the processes at the steps S823 to S826 is included in the contents notified to the host computer 100 at the step S829, the fact that the entry matching the execution condition has been subjected to the processes may be notified together with the information of the mismatch. The number of entries that have been subjected to the processes may be notified as information indicating the fact that the entry matching the execution condition has been subjected to the processes.

When the host computer 100 specifies the number of entries at the step S827, and when the number of valid entries in the error information management table 221 is lower than the number of entries specified by the host computer 100, it is determined that a mismatch exists. In addition, when the host computer 100 specifies a minimum number of errors to be refreshed at the step S827, and when all of the numbers of errors managed by the error information management table 221 are lower than the minimum number of the errors specified by the host computer, it is determined that a mismatch exists. Moreover, when the host computer 100 specifies the logical address to be refreshed at the step S827, and when the logical addresses specified by the host computer 100 include a logical address not managed by the error information management table 221, it is determined that a mismatch exists.

In the sixth embodiment, the example in which the logical address of the entry meeting the condition specified by the host computer is refreshed even when a mismatch exists between the condition specified by the host computer 100 and the error information management table 221 has been described. When a mismatch exists between the condition specified by the host computer 100 and the error information management table 221, the refresh process may not be executed. In this case, the process at the step S827 is executed before the process at the step S821 is executed, and when a mismatch exists, the processor 240 notifies the host computer 100 of error end to terminate the refresh command process.

As described above, according to the sixth embodiment of the technology, the host computer 100 is allowed to acquire the information of the error information management table 221 to effectively schedule the commands executed by the memory system.

(7. Seventh Embodiment)

In the above-described first to sixth embodiments, the error information is managed by the memory controller 200. However, the error information may be managed by the host computer 100. In a seventh embodiment, it is assumed that the host computer 100 manages the error information. This enables the host computer 100 to grasp error information without using the table information acquiring command as with the sixth embodiment, and to effectively schedule the commands executed by the memory system.

(Configuration of Information Processing System)

Figure 29:
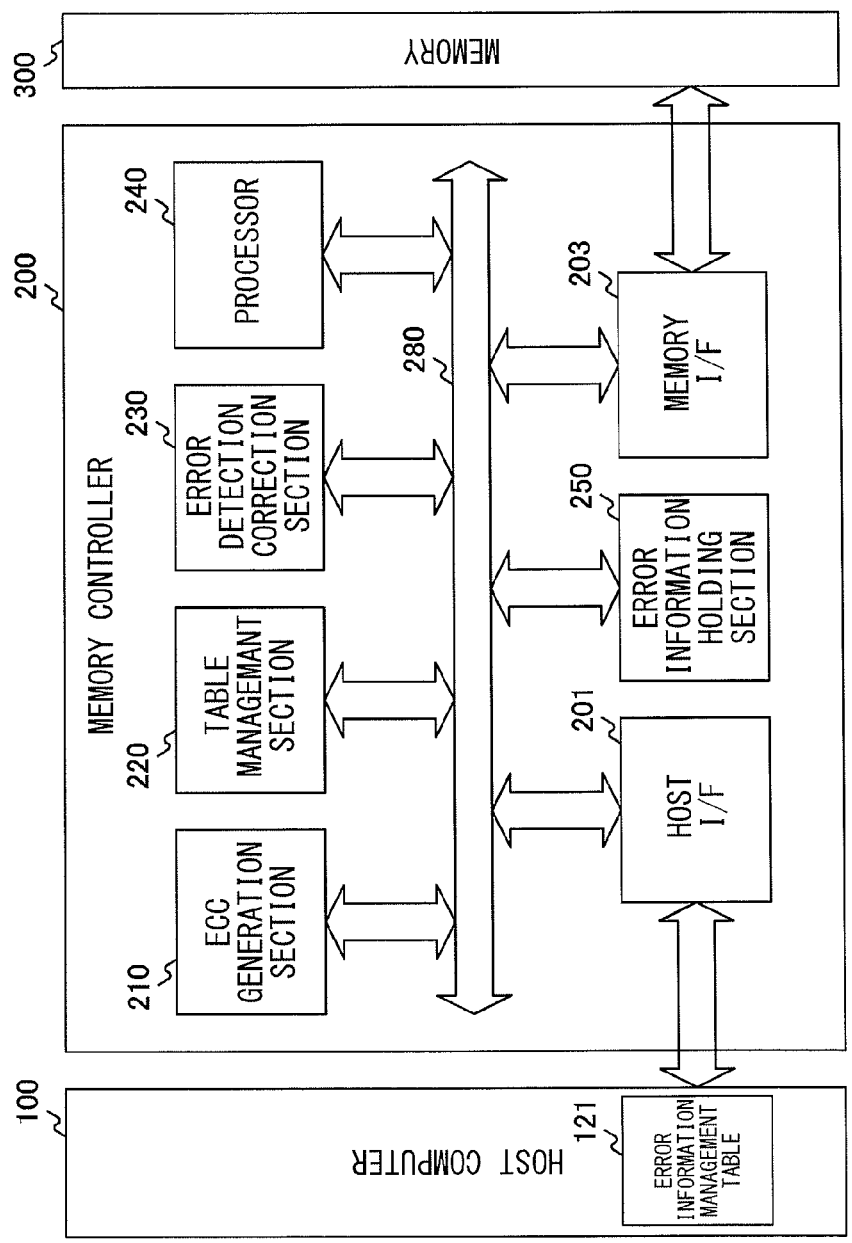
FIG. 29 is a diagram illustrating a configuration example of an information processing system according to a seventh embodiment of the technology.

FIG. 29 is a diagram illustrating a configuration example of an information processing system according to the seventh embodiment of the technology. The information processing system includes the host computer 100, the memory controller 200, and the memory 300, as with the first to sixth embodiments. The memory controller 200 and the memory 300 configure a storage system. However, unlike the first to sixth embodiments, an error information management table 121 is managed by the host computer 100, and the memory controller 200 includes an error information holding section 250.

The error information management table 121 includes the similar structure to the error information management table 221 described in the first to sixth embodiments, and manages addresses and the number of detected errors in respective entries. Note that the error information management table 121 is a specific example of "error information management section" in the technology.

The error information holding section 250 is configured to temporarily hold the number of errors detected by the error detection correction section 230 and a logical address where the error occurs. The data size held by the error information holding section 250 is a size corresponding to a maximum data size read by the host computer 100 at one read command. For example, in the case where the size of a region represented by one logical address is 512 bytes, when the host computer 100 reads at most 128 kB data at one read command, 256 pieces of the numbers of errors are allowed to be held.

(Operation of Read Command Process)

Figure 30:
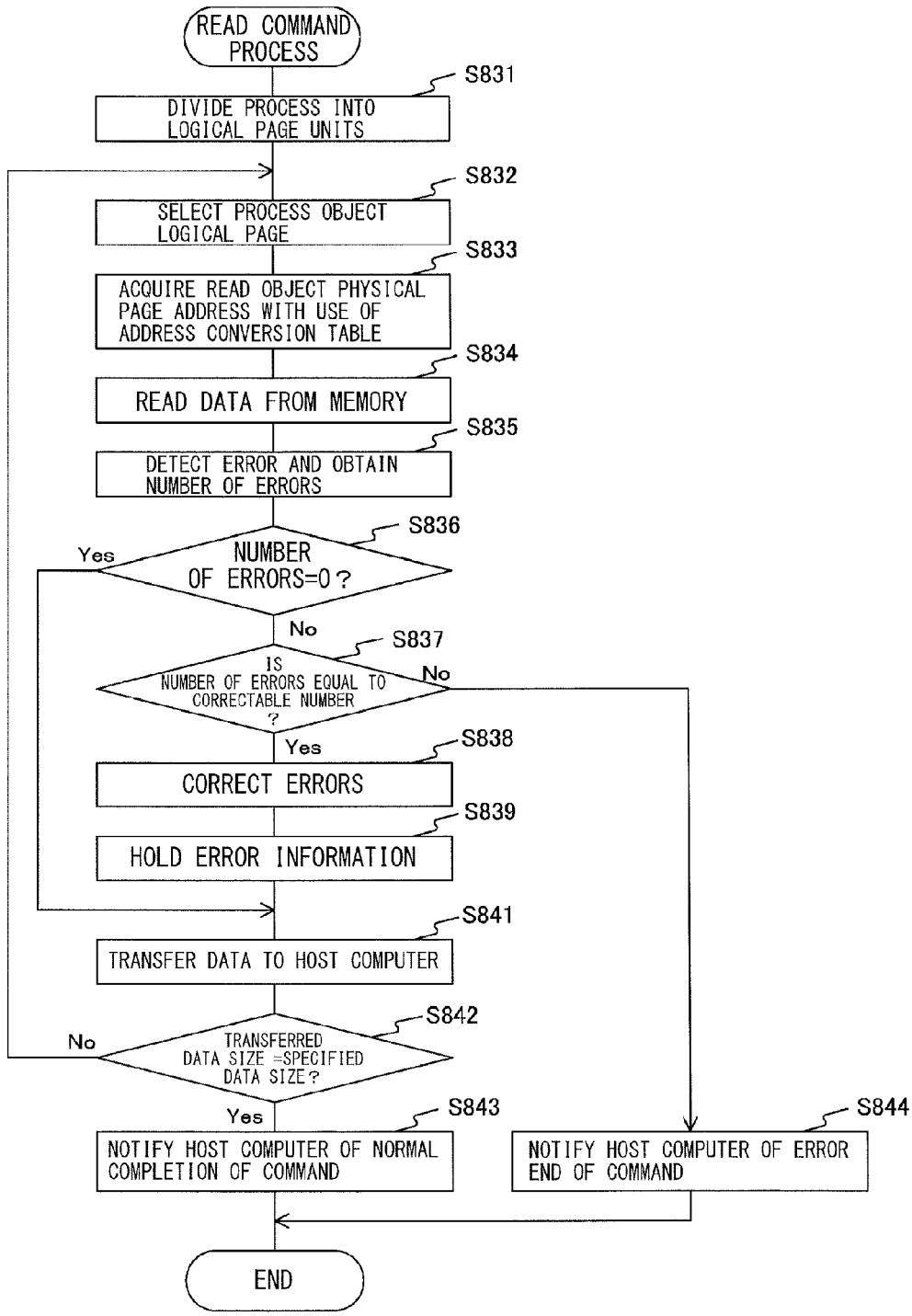
FIG. 30 is a flowchart illustrating an example of a process procedure of a read command process according to the seventh embodiment of the technology.

FIG. 30 is a flowchart illustrating an example of a process procedure of a read command process according to the seventh embodiment of the technology.

The read command process in the seventh embodiment is substantially similar to that in the first embodiment described with reference to FIG. 6 except that the error information is held in the error information holding section 250 instead of the update process (step S920) of the error information management table 221. In other words, the number of errors detected at a step S835 and the logical address determined at a step S832 are held in the error information holding section 250 (step S839).

At the time of process completion, the processor 240 notifies the host computer 100 of the logical address where errors are detected and the number of detected errors that are held by the error information holding section 250, as well as normal completion of the read command to terminate the read command process (step S843). On the other hand, when the number of detected errors exceeds the correctable number of errors (No at the step S837), the processor 240 notifies the host computer 100 of error end of the read command to terminate the read command process (step S844). At this time, the logical address where errors are detected and the number of errors that are held by the error information holding section 250, as well as the logical address determined correctable at the step S837 and the fact that the number of detected errors exceeds the correctable number of errors are notified to the host computer 100.

Incidentally, although the logical address and the number of errors detected during the read command execution are notified to the host computer 100 at the timing of command completion notification at the steps S843 and S844 in this example, the notification method is not limited thereto. At the time of command completion notification, only error detection may be notified, and information including the detected logical address and the number of errors may be separately acquired by another command.

(Operation of Error Information Management Table Update Process)

Figure 31:
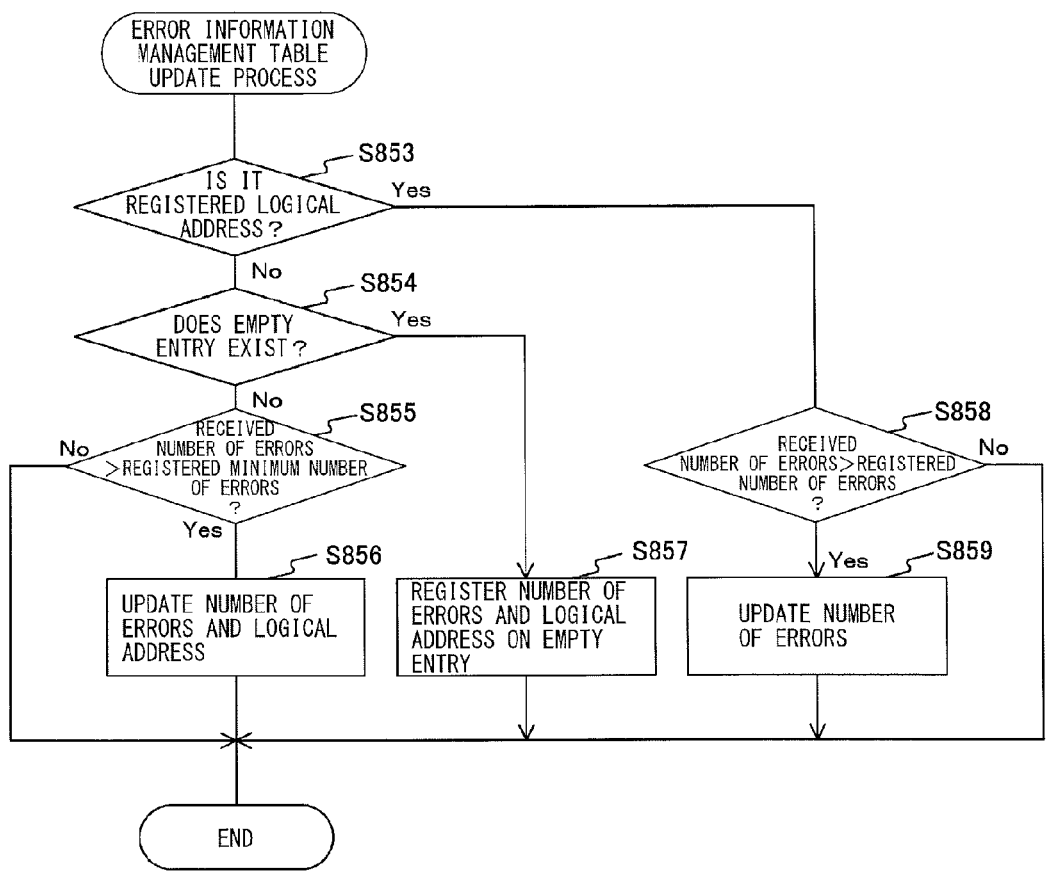
FIG. 31 is a flowchart illustrating an example of a process procedure of update of an error information management table according to the seventh embodiment of the technology.

FIG. 31 is a flowchart illustrating an example of a process procedure of update of an error information management table according to the seventh embodiment of the technology. In the seventh embodiment, the error information management table update process is executed by the host computer 100. Specifically, when the host computer 100 acquires the error information (the logical address where errors are detected and the number of detected errors) from the memory controller 200 after completing the read command process, the host computer 100 updates information of the error information management table 121.

First, it is determined whether the logical address where errors are detected that is received by the host computer 100 from the memory controller 200 is a logical address registered on the error information management table 121 (step S853). When the logical address where errors are detected is the registered logical address (Yes at the step S853), it is determined whether the received number of errors is larger than the registered number of errors (step S858). When the received number of errors is larger than the registered number of errors (Yes at the step S858), the number of errors in the corresponding entry in the error information management table 121 is updated with the received number of errors (step S859).

When the logical address where errors are detected is not registered on the error information management table 121 (No at the step S853), it is determined whether the error information management table 121 has an empty entry (step S854). When the error information management table 121 has an empty entry (Yes at the step S854), the received logical address of errors and the received number of errors are registered on the empty entry (step S857).

On the other hand, when the error information management table 121 has no empty entry (No at the step S854), the received number of errors is compared with a minimum value out of the numbers of errors registered on the respective entries (step S855). When the received number of errors is larger than the minimum value (Yes at the step S855), the entry having the minimum value is updated with the received number of errors and the logical address thereof (step S856).

(Operation of Refresh Command Process)

In the seventh embodiment of the technology, although the error information is managed by the host computer 100, the operation of the refresh command process is basically similar to that described with reference to FIG. 11 except that, as will be described below, it is determined whether the logical address that has not been subjected to the refresh command process exists and address conversion from the logical address to the physical address is executed. By the refresh command, logical addresses to be refreshed are transmitted as a parameter. The host computer 100 is allowed to specify a plurality of logical addresses by one refresh command.

Figure 32:
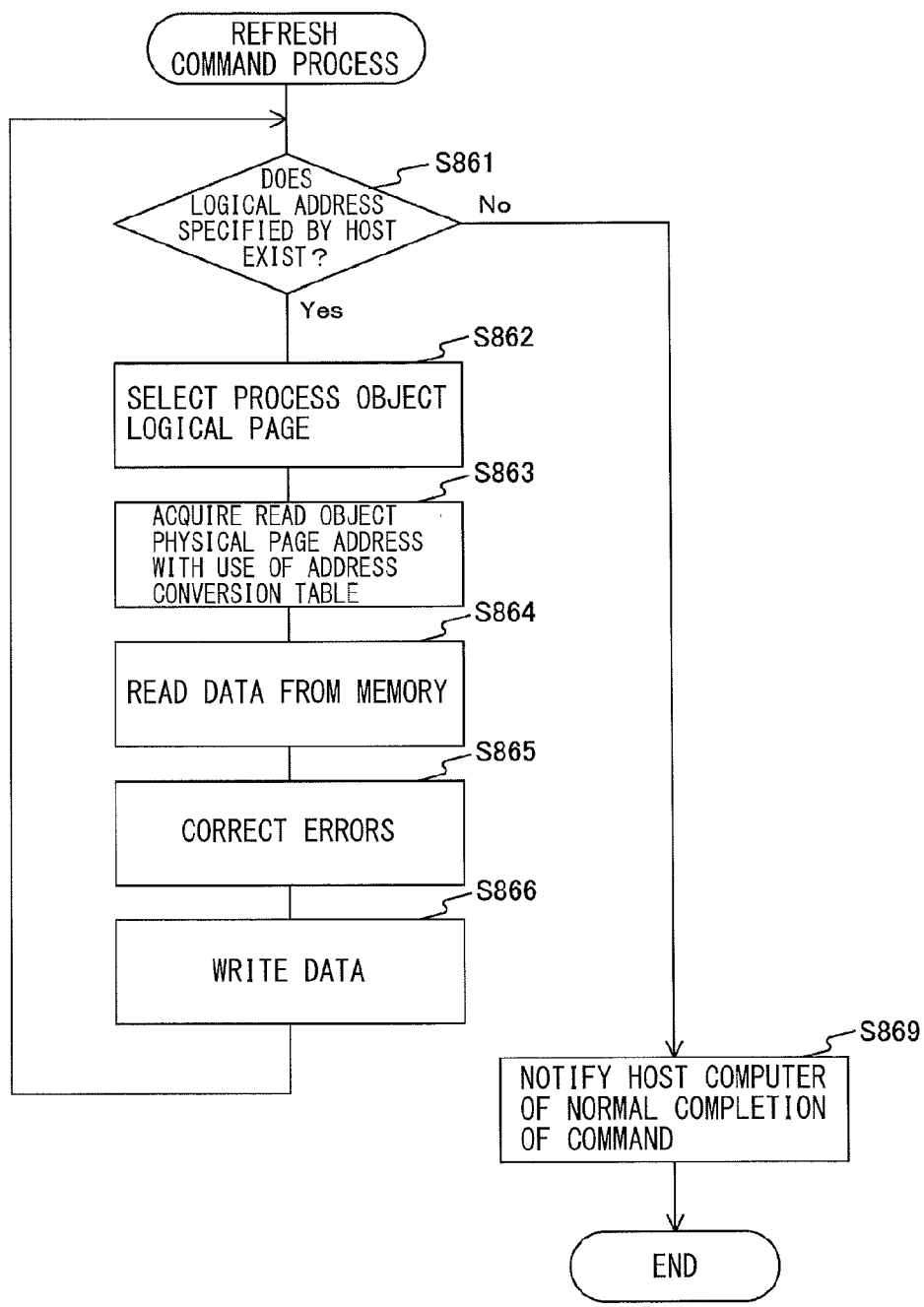
FIG. 32 is a flowchart illustrating an example of a process procedure of a refresh command process according to the seventh embodiment of the technology.

FIG. 32 is a flowchart illustrating an example of a process procedure of the refresh command process according to the seventh embodiment of the technology.

The processor 240 determines whether an unprocessed logical address that has not been subjected to the processes at the steps S863 to S866 exists among the logical addresses specified by the host computer 100 (step S861). When unprocessed logical address does not exist (No at the step S861), the processor 240 notifies the host computer 100 of normal completion of the refresh command process to terminate the refresh command process (step S869). When unprocessed logical addresses exist (Yes at the step S861), the processor 240 executes the following processes.

The processor 240 selects a logical address to be refreshed from the unprocessed logical addresses (step S862). In the seventh embodiment, it is assumed that the logical address to be refreshed is selected in ascending order.

The processor 240 uses the address conversion table 222 to converts the logical address determined at the step S862 into a physical address (step S863).

The processor 240 specifies the physical address converted at the step S863 to read the data from the specified physical address of the memory 300, and transfers the read data to the error detection correction section 230 (step S864). The size of the data to be transferred is 528 bytes.

The error detection correction section 230 executes error detection of the 528-byte data transferred at the step S864, and when errors are detected, the error detection correction section 230 further executes error correction (step S865).

The 528-byte data including the 512-byte data corrected at the step S865 and the 16-byte ECC is transferred from the error detection correction section 230, the physical address converted at the step S863 is specified, and the 528-byte data is written into the specified physical address of the memory 300 (step S866). After that, the processes at the step S861 and following steps are repeated.

After the host computer 100 receives the completion notification of the refresh command process from the memory controller 200, the host computer 100 updates the error information management table 121. The host computer 100 updates, with "0", the number of errors in an entry corresponding to the logical address specified by the refresh command out of entries of the error information management table 121.

(Operation of Write Command Process)

In the seventh embodiment of the technology, although the host computer 100 manages the error information, the operation of the write command process is basically similar to that described with reference to FIG. 13. However, although the process of updating an entry of the error information management table 221 to an empty entry is executed in the first embodiment (steps S956 and S957), the process is unnecessary in the seventh embodiment.

Figure 33:
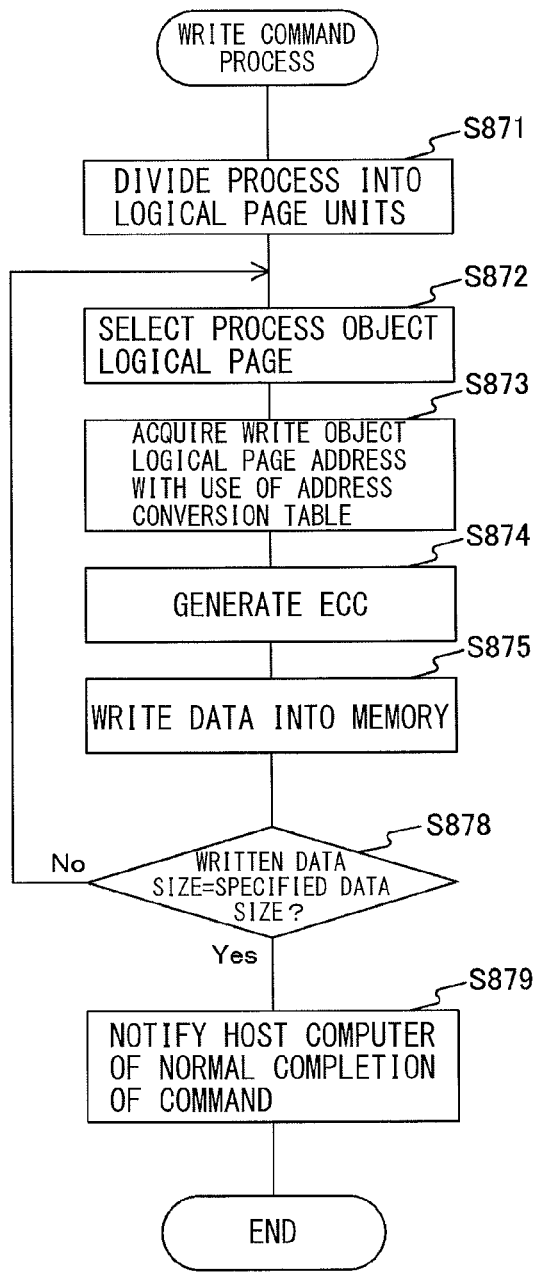
FIG. 33 is a flowchart illustrating an example of a process procedure of a write command process according to the seventh embodiment of the technology.

FIG. 33 is a flowchart illustrating an example of a process procedure of the write command process in the seventh embodiment of the technology.

The processor 240 divides the process into logical address units, based on a head logical address of a writing destination and a data size that are received by the host interface 201 (step S871). One logical address is processed by one process.

The processor 240 selects and determines a logical address to be subjected to the write process (step S872). In the seventh embodiment, the logical address to be subjected to the write process is determined in order based on a head logical address.

The processor 240 uses the address conversion table 222 held in the table management section 220 to convert the logical address selected at the step S872 into a physical address (step S873).

The processor 240 transfers the 512-byte data of one logical address received by the host interface 201 to the ECC generation section 210 (step S874). The ECC generation section 210 generates 16-byte ECC with respect to the received 512-byte data.

The processor 240 specifies the physical address obtained at the step S953 to write the 528-byte data transferred from the ECC generation section 210 into the specified physical address of the memory 300 (step S875).

In the write command process, the processor 240 compares the sum of the sizes of the data written into the memory 300 with the data size specified by the write command (step S878). When the sum of the sizes of the written data is smaller than the specified data size (No at the step S878), the processes at the step S872 and following steps are repeated. On the other hand, when the sum of the sizes of the written data reaches the specified data size (Yes at the step S878), the processor 240 notifies the host computer 100 of normal completion of the write command process to terminate the write command process (step S879).

After the host computer 100 receives the completion notification of the write command process from the memory controller 200, the host computer 100 updates the error information management table 121. The host computer 100 updates, with "0", the number of errors in an entry corresponding to the logical address specified by the write command out of the entries of the error information management table 121.

As described above, according to the seventh embodiment of the technology, the host computer 100 is allowed to grasp the error information, which makes it possible to effectively schedule the commands executed by the memory system.

Incidentally, the above-described respective embodiments are examples for carrying out the present technology, and the matters in the respective embodiments have a correspondence relationship with the matters used to define the invention in the appended claims. Likewise, the matters used to define the invention in the appended claims have a correspondence relationship with the matters having the same name in the respective embodiments of the present technology. However, the present technology is not limited to the respective embodiments, and other various modifications may occur as they are within the scope of the appended claims or the equivalents thereof.

In addition, the process procedures described in the above-described respective embodiments may be regarded as methods having respective series of procedures, and may be regarded as program causing a computer to execute the series of procedures or a recording medium holding the program. As the recording medium, for example, Compact Disc (CD), MiniDisc (MD), Digital Versatile Disc (DVD), a memory card, Blu-ray Disc (registered trademark), and the like may be used.

Note that the present technology may be configured as follows.

(1) A storage controller including:
an error information management section configured to manage error information in a plurality of addresses of a memory; and
a refresh object determination section configured to determine a refresh object address in the memory based on the error information.

(2) The storage controller according to (1), wherein
the error information management section manages, as the error information, an address where errors are detected in association with the number of detected errors, and
the refresh object determination section determines the address associated with the number of errors as the refresh object address, based on the number of errors.

(3) The storage controller according to (2), wherein the error information management section determines whether the error information is excluded from management objects, based on the number of errors.

(4) The storage controller according to (2) or (3), wherein
the error information management section further manages, as the error information, the number of reading times in association with the address, and
the refresh object determination section determines the address associated with the number of reading times as the refresh object address, based on the number of reading times.

(5) The storage controller according to any one of (1) to (4), wherein when errors occur in the memory, the error information management section determines whether the error information is excluded from management objects, based on a condition specified in advance.

(6) The storage controller according to any one of (1) to (5), wherein
the error information management section manages, as the error information, a physical address of the memory where errors are detected in association with the number of detected errors, and
the refresh object determination section determines the physical address associated with the number of errors as the refresh object address, based on the number of errors.

(7) The storage controller according to any one of (1) to (6), further including an address conversion section configured to convert a logical address into a physical address of the memory, the logical address being used in an access command from a host computer to the memory, wherein
the error information management section manages, as the error information, the logical address of the memory where errors are detected in association with the number of detected errors, and
the refresh object determination section selects the logical address associated with the number of errors based on the number of errors, and converts the logical address into the physical address with use of the address conversion section, to determine the physical address as the refresh object address.

(8) The storage controller according to any one of (1) to (7), wherein the error information management section holds data stored in each of the addresses in the memory, and uses the data in accessing the address of the memory, the data being associated with the error information.

(9) The storage controller according to (8), wherein the error information management section holds an error correcting code in addition to the data.

(10) The storage controller according to (8) or (9), wherein the error information management section holds the data only when the number of errors included in the error information satisfies a predetermined condition.

(11) The storage controller according to any one of (1) to (10), wherein the error information management section notifies a host computer of the error information when receiving an acquisition command of the error information from the host computer.

(12) A storage device including:
a memory;
an error information management section configured to manage error information in a plurality of addresses of the memory; and
a refresh object determination section configured to determine a refresh object address in the memory, based on the error information.

(13) An information processing system including:
a memory;
a host computer configured to issue an access command with respect to the memory;
an error information management section configured to manage error information in a plurality of addresses of the memory; and a refresh object determination section configured to determine a refresh object address in the memory, based on the error information.

(14) The information processing system according to (13), wherein the host computer includes the error information management section and the refresh object determination section.

(15) A storage control method including:
managing error information in a plurality of addresses of a memory; and
determining a refresh object address in the memory, based on the error information.

What is claimed is:

1. A storage controller comprising:
    an error information management section configured to manage error information in a plurality of addresses of a memory, wherein the error information includes an address of the memory, where errors are detected, in association with a number of errors detected for the address; and
    a refresh object determination section configured to determine a refresh object address in the memory based on the error information,
    wherein a plurality of refresh object addresses are refreshed in an order based on the number of errors detected for respective of the plurality refresh object addresses.

2. The storage controller according to claim 1, wherein the refresh object determination section is configured to determine the address associated with the number of errors as the refresh object address, based on the number of errors.

3. The storage controller according to claim 1, wherein the error information management section is configured to determine whether the error information is excluded from management objects, based on the number of errors.

4. The storage controller according to claim 1, wherein
    the error information management section is configured to manage, as the error information, the number of reading times in association with the address, and
    the refresh object determination section is configured to determine the address associated with the number of reading times as the refresh object address, based on the number of reading times.

5. The storage controller according to claim 1, wherein in case errors occur in the memory, the error information management section is configured to determine whether the error information is excluded from management objects, based on a condition specified in advance.

6. The storage controller according to claim 1, wherein
    the error information management section is configured to manage, as the error information, a physical address of the memory where errors are detected in association with the number of detected errors, and
    the refresh object determination section is configured to determine the physical address associated with the number of errors as the refresh object address, based on the number of errors.

7. The storage controller according to claim 1, further comprising an address conversion section configured to convert a logical address into a physical address of the memory, the logical address being used in an access command from a host computer to the memory, wherein
    the error information management section is configured to manage, as the error information, the logical address of the memory where errors are detected in association with the number of detected errors, and
    the refresh object determination section is configured to
        select the logical address associated with the number of errors based on the number of errors, and
        convert the logical address into the physical address with use of the address conversion section, to determine the physical address as the refresh object address.

8. The storage controller according to claim 1, wherein the error information management section is configured to hold data stored in each of the plurality of addresses in the memory, and use the data in accessing the address of the memory, the data being associated with the error information.

9. The storage controller according to claim 8, wherein the error information management section is configured to hold an error correcting code in addition to the data.

10. The storage controller according to claim 8, wherein the error information management section is configured to hold the data in case the number of errors included in the error information satisfies a predetermined condition.

11. The storage controller according to claim 1, wherein the error information management section is configured to notify a host computer of the error information in case receiving an acquisition command of the error information from the host computer.

12. The storage controller according to claim 1, wherein in an event the number of errors are the same between some of the plurality refresh object addresses, the physical address are refreshed in an ascending order of the plurality refresh object addresses.

13. A storage device comprising:
    a memory;
    an error information management section configured to manage error information in a plurality of addresses of the memory, wherein the error information includes an address of the memory, where errors are detected, in association with a number of errors detected for the address; and
    a refresh object determination section configured to determine a refresh object address in the memory, based on the error information,
    wherein a plurality of refresh object addresses are refreshed in an order based on the number of errors detected for respective of the plurality refresh object addresses.

14. An information processing system comprising:
    a memory;
    a host computer configured to issue an access command with respect to the memory;
    an error information management section configured to manage error information in a plurality of addresses of the memory,
    wherein the error information includes an address of the memory, where errors are detected, in association with a number of errors detected for the address; and
    a refresh object determination section configured to determine a refresh object address in the memory, based on the error information,
    wherein a plurality of refresh object addresses are refreshed in an order based on the number of errors detected for respective of the plurality refresh object addresses.

15. The information processing system according to claim 14, wherein the host computer includes the error information management section and the refresh object determination section.

16. A storage control method comprising:
    managing error information in a plurality of addresses of a memory, wherein the error information includes an address of the memory, where errors are detected, in association with a number of errors detected for the address; and determining a refresh object address in the memory, based on the error information, wherein a plurality of refresh object addresses are refreshed in an order based on the number of errors detected for respective of the plurality refresh object addresses.

* * * * *